US011469371B2

United States Patent
Song et al.

(10) Patent No.: US 11,469,371 B2
(45) Date of Patent: Oct. 11, 2022

(54) SOT-MRAM CELL IN HIGH DENSITY APPLICATIONS

(71) Applicant: Taiwan Semiconductor Manufacturing Co., Ltd., Hsin-Chu (TW)

(72) Inventors: Ming Yuan Song, Hsinchu (TW); Shy-Jay Lin, Jhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 254 days.

(21) Appl. No.: 16/822,352

(22) Filed: Mar. 18, 2020

(65) Prior Publication Data

US 2021/0066580 A1 Mar. 4, 2021

Related U.S. Application Data

(60) Provisional application No. 62/893,325, filed on Aug. 29, 2019.

(51) Int. Cl.
| | |
|---|---|
| *H01L 43/02* | (2006.01) |
| *H01L 43/08* | (2006.01) |
| *H01L 43/12* | (2006.01) |
| *G11C 11/16* | (2006.01) |
| *H01L 27/22* | (2006.01) |

(52) U.S. Cl.
CPC .......... *H01L 43/02* (2013.01); *G11C 11/161* (2013.01); *G11C 11/1657* (2013.01); *G11C 11/1673* (2013.01); *G11C 11/1675* (2013.01); *H01L 27/224* (2013.01); *H01L 43/08* (2013.01); *H01L 43/12* (2013.01)

(58) Field of Classification Search
CPC ....... H01L 43/02; H01L 27/224; H01L 43/08; H01L 43/12; G11C 11/161; G11C 11/1657; G11C 11/1673; G11C 11/1675
USPC ........................................................ 257/421
See application file for complete search history.

(56) References Cited

U.S. PATENT DOCUMENTS

| | | | |
|---|---|---|---|
| 2019/0305042 A1* | 10/2019 | Chen | G11C 11/1673 |
| 2019/0386203 A1* | 12/2019 | Gosavi | H01L 27/224 |

OTHER PUBLICATIONS

Yang et al. "Threshold Switching Selector and 1S1R Integration Development for 3D Cross-Point STT-MRAM." IEEE 2017 IEEE International Electron Devices Meeting (IEDM), published on Jan. 25, 2018.

(Continued)

*Primary Examiner* — Jami Valentine Miller
(74) *Attorney, Agent, or Firm* — Eschweiler & Potashnik, LLC

(57) ABSTRACT

In some embodiments, the present disclosure relates to a memory device that includes a spin orbit torque (SOT) layer arranged over a substrate. A magnetic tunnel junction (MTJ) structure may be arranged over the SOT layer. The MTJ structure includes a free layer, a reference layer, and a diffusion barrier layer disposed between the free layer and the reference layer. A first conductive wire is arranged below the SOT layer and coupled to the SOT layer. A second conductive wire is arranged below the SOT layer and coupled to the SOT layer. A third conductive wire is arranged over the MTJ structure. The memory device further includes a first selector structure arranged between the first conductive wire and the SOT layer.

20 Claims, 27 Drawing Sheets

(56) References Cited

OTHER PUBLICATIONS

Bishnoi et al. "Architectural Aspects in Design and Analysis of SOT-Based Memories." KIT—University of the State of Baden-Wuerttemberg and National Research Center of the Helmholtz Association. Published in 2014.

* cited by examiner

SOT-MRAM CELL IN HIGH DENSITY APPLICATIONS

REFERENCE TO RELATED APPLICATION

This Application claims the benefit of U.S. Provisional Application No. 62/893,325, filed on Aug. 29, 2019, the contents of which are hereby incorporated by reference in their entirety.

BACKGROUND

Many modern day electronic devices include non-volatile memory. Non-volatile memory is electronic memory that is able to store data in the absence of power. A magnetoresistive random access memory (MRAM) is a type of non-volatile memory that stores information according to the direction of magnetic moments in magnetic films layers. A promising candidate for MRAM devices is a spin orbit torque (SOT) MRAM device, which uses an SOT layer to reduce power consumption and increase endurance of the SOT MRAM device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
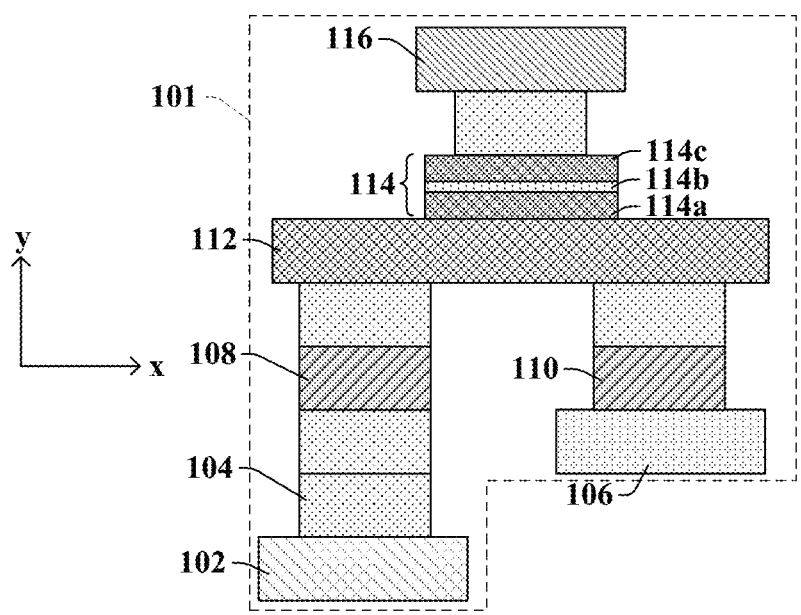
FIGS. 1A, 1B, 1C, and 1D illustrate various views and schematics of some embodiments of a spin orbit torque (SOT) magnetoresistive random access memory (MRAM) device comprising a magnetic tunnel junction (MTJ) structure over a SOT layer having a first selector structure between a source line (SL) and the SOT layer and a second selector structure between a write word line (WWL) and the SOT layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetoresistive random-access memory (MRAM) device includes a magnetic tunnel junction (MTJ) structure arranged between a first electrode and a second electrode. The MTJ structure may include first and second ferromagnetic films separated by a thin non-magnetic barrier layer, typically a quantum mechanical tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel orientation, electrons will relatively more easily tunnel through the tunnel barrier layer, meaning that the MTJ structure is in a low-resistance state, corresponding to, for example, a first data value (e.g., a logical '1'). Conversely, if the magnetization directions of the reference layer and free layer are in an antiparallel orientation, electrons will have more difficulty tunneling through the tunnel barrier layer, meaning that the MTJ structure is in a high-resistance state corresponding to, for example, a second data value (e.g., a logical '0'). The MTJ structure can be switched between two states of electrical resistance by reversing the magnetization direction of the free layer.

A mechanism that can be utilized to switch the state of the free layer includes spin orbit torque (SOT), in which an in-plane current is applied across an adjacent SOT layer, as in so called "SOT MRAM." This in turn facilitates switching the state of the free layer without applying a current across the MTJ structure, thereby increasing endurance and decreasing power consumption of the SOT MRAM device. An SOT MRAM device includes a MTJ structure arranged over and coupled to an SOT layer (e.g., platinum, tungsten, tantalum) that is coupled to an interconnect structure. A write voltage may be applied to the SOT layer to switch a state of the free layer disposed in the MTJ structure.

However, an SOT MRAM device is a three-terminal device, in some embodiments. For example, each MTJ structure in an SOT MRAM device may be coupled to at least 3 transistors, disposed over a substrate. Thus, an SOT MRAM device may utilize a large surface area of a substrate for a single MTJ structure, resulting in a low device per area density.

To produce a high device per area density, various embodiments of the present disclosure relate to an SOT MRAM device coupled to control circuitry, wherein each MTJ structure in the SOT MRAM device is coupled to two selector structures to control current direction and current pathways for each MTJ structure.

For example, in some embodiments of the present disclosure, the SOT MRAM device may comprise an array of SOT MRAM cells. Each SOT MRAM cell may be coupled to a Read Word line (RWL) coupled to a top layer of an MTJ structure, and a Source Line (SL) and a Write Word line (WWL) coupled to a bottom surface of the SOT layer. In some embodiments, each SOT MRAM cell may comprise a first selector structure arranged between the SL and the SOT layer, and a second selector structure arranged between the WWL and the SOT layer. Upon an applied write voltage to the WWL and the SL line, the first and second selector structures may turn "ON" (e.g., change from an insulator state to a conductive state) allowing a current to be applied across the SOT layer, thereby writing a data state to the MTJ structure. Further, upon an applied read voltage to the RWL and the SL, the first selector structure may turn "ON" while the second selector structure may remain "OFF" to allow a current to be applied across the MTJ structure, thereby reading a data state stored in the MTJ structure without changing the stored data state.

Thus, in an SOT MRAM array, although SOT MRAM cells may share or more terminals (e.g., SL, WWL, RWL) with one another, the selector structures allow each SOT MRAM cell to be independently selected for data storage by the control circuitry, thereby increasing the device per area density.

FIG. 1A illustrates a cross-sectional view 100A of some embodiments of an SOT MRAM cell comprising an MTJ structure coupled to a RWL, a WWL, and a SL.

As illustrated in the cross-sectional view 100A of FIG. 1A, an SOT MRAM cell 101 includes an MTJ structure 114 overlying an SOT layer 112. In some embodiments, the MTJ structure 114 comprises a free layer 114a, a diffusion barrier layer 114b, and a reference layer 114c. In some embodiments, the free layer 114a is arranged between the diffusion barrier layer 114b and the SOT layer 112, and the reference layer 114c is arranged over the diffusion barrier layer 114b. The free layer 114a and the reference layer 114c are ferromagnetic materials, and the relationship of the magnetic orientations (e.g., parallel, anti-parallel) of the free layer 114a and the reference layer 114c may determine a data state of the SOT MRAM cell 101. The SOT layer 112, in some embodiments, directly contacts the free layer 114a of the MTJ structure 114, and current traveling through the SOT layer 112 may change the magnetic orientation of the free layer 114a to write data onto the SOT MRAM cell 101. In some embodiments, the SOT layer 112 may comprise, for example, a conductive metal such as tantalum, platinum, tungsten, or the like.

In some embodiments, the MTJ structure 114 is coupled to a Source line (SL) 102, a Write Word line (WWL) 106, and a Read Word line (RWL) 116. For example, in some embodiments, the SL 102 and the WWL 106 are arranged beneath the SOT layer 112 and the MTJ structure 114, and the RWL 116 is arranged over the MTJ structure 114. Further, in some embodiments, a first selector structure 108 is arranged between the SL 102 and the SOT layer 112, and a second selector structure 110 is arranged between the WWL 106 and the SOT layer 112. In some embodiments, the SOT MRAM cell 101 comprises contact vias 104 that electrically couple various features of the SOT MRAM cell 101 (e.g., SOT layer 112, SL 102, WWL 106, RWL 116, first selector structure 108, etc.) to one another.

In some embodiments, the first selector structure 108 and the second selector structure 110 each comprise a switch layer that is naturally an insulator. The switch layer may be made conductive and thus, turned "ON" when a voltage bias exceeding a threshold voltage of the switch layer is applied, in some embodiments. Thus, whether the first selector structure 108 is turned "ON" is dependent on at least a signal (e.g., voltage, current) applied to the SL 102, and whether the second selector structure 110 is turned "ON" is dependent on at least a signal (e.g., voltage, current) applied to the WWL 106. In some embodiments, the first and/or second selector structures 108, 110 comprise, for example, a phase change material (e.g., a chalcogenide such as germanium antimony tellurium), niobium oxide, copper germanium selenium, hafnium oxide, arsenic tellurium germanium silicon nitride, or some other suitable material that can switch between insulating and conducting upon an applied voltage bias.

Further, in some embodiments, the second selector structure 110 is laterally spaced apart from the first selector structure 108 in a first direction x, whereas the SOT layer 112 is arranged vertically above the first and second selector structures 108, 110 in a second direction y. In some embodiments, the first and second selector structures 108, 110 are a same type of selector structure, and thus, comprise a same structure (e.g., materials, thickness, etc.). In such embodiments, the first and second selector structures 108, 110 may have a same threshold voltage. In other embodiments, the first selector structure 108 may be a different type of selector structure, and thus, comprise a different structure (e.g., materials, thickness, etc.) than the second selector structure 110. Further, in some embodiments, the first and second selector structures 108, 110 comprise a structure (e.g., materials, thickness, etc.) that is configured to allow current to pass bidirectionally (e.g., in a positive second direction y and in a negative second direction y). Thus, upon signals (e.g., current, voltage) applied to the SL 102, WWL 106, and/or RWL 116, the first and/or second selector structures 108, 110 may be selectively turned "ON" to read or write onto the SOT MRAM cell 101.

Figure 1B:
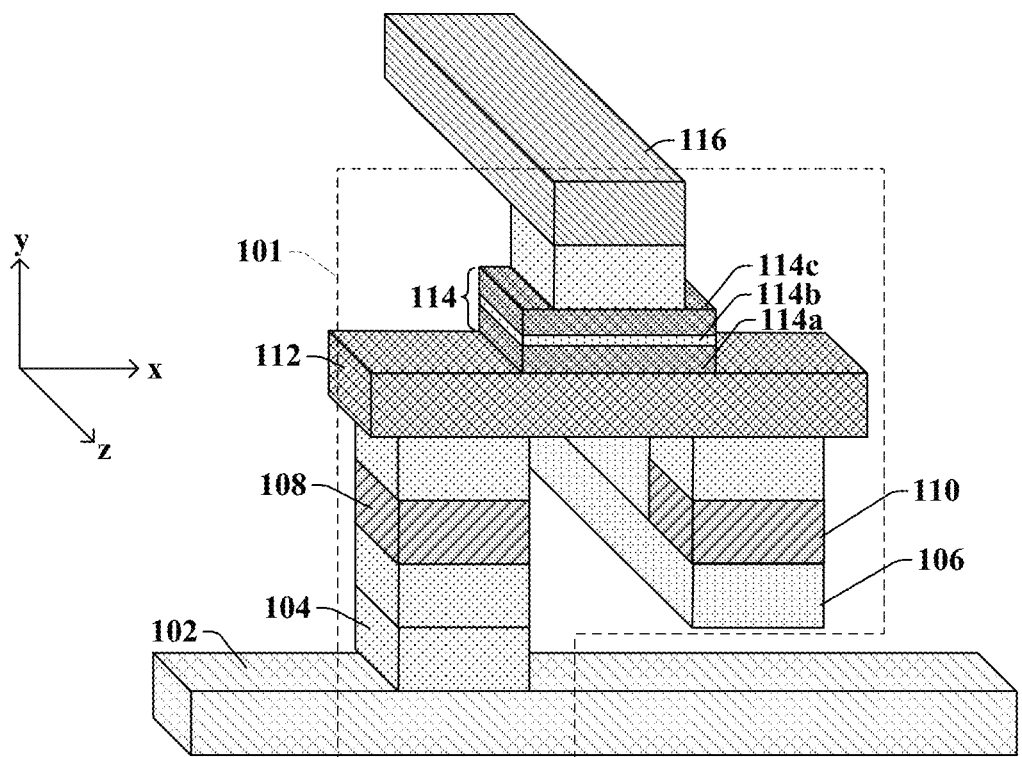

FIG. 1B illustrates a perspective view 100B of some embodiments corresponding to the cross-sectional view 100A of FIG. 1A.

In some embodiments, the SL 102 may extend in the first direction x, and the WWL 106 and the RWL 116 may extend in the third direction z that is perpendicular to the first direction x. It will be appreciated that other relationships between the SL 102, WWL 106, and RWL 116 are also within the scope of the disclosure. For example, in some other embodiments, the SL 102 and the RWL 116 may extend in the same direction, such as the first direction x, whereas the WWL 106 may extend in a different direction, such as the third direction z. In yet other embodiments, the SL 102, WWL 106, and RWL 116 may all extend in the same direction or may all extend in different directions from one another, for example.

To write a first data value (e.g., a logical '1') onto the SOT MRAM cell 101 of FIG. 1B, a current may applied across the SOT layer 112 to induce an overall parallel orientation in the MTJ structure 114 between the free layer 114a and the reference layer 114c. In some embodiments, signals (e.g., voltage, current) are applied to the MTJ structure 114 and/or SOT layer 112 through the SL 102, the WWL 106, and the RWL 116. Thus, to write the first data value (e.g., a logical '1') onto the SOT MRAM cell 101, in some embodiments, a first set of write conditions are applied to the SOT MRAM cell 101, wherein a write voltage is applied to the SL 102, the WWL 106 is grounded, and the RWL 116 is electrically floating. In such embodiments, a threshold voltage of the first selector structure 108 is at most equal to one half of the write voltage, and a threshold voltage of the second selector structure 110 is at most equal to one half of the write voltage. Thus, when the first set of write conditions are applied to the SOT MRAM cell 101, the first selector structure 108 is turned "ON" or made conductive and the second selector structure 110 is turned "ON" or made conductive. Thus, a current may flow through the SOT layer 112 causing the free layer 114a of the MTJ structure 114 to have a parallel orientation with respect to the reference layer 114c of the MTJ structure 114, thereby storing the first data value (e.g., a logical '1') in the SOT MRAM cell 101.

To write a second data value (e.g., a logical '0') onto the SOT MRAM cell 101 of FIG. 1A, a current may be applied across the SOT layer 112 to induce an anti-parallel orientation in the MTJ structure 114 between the free layer 114a and the reference layer 114c. In such embodiments, a second set of write conditions are applied to the SOT MRAM cell 101, wherein the write voltage is applied to the WWL 106, the SL 102 is grounded, and the RWL 116 is electrically floating. In such embodiments, the first selector structure 108 is turned "ON" or made conductive and the second selector structure 110 is turned "ON" or made conductive. Thus, a current may flow through the SOT layer 112 in an opposite direction compared to the current flowing through the SOT layer 112 when the first set of write conditions are applied to the SOT MRAM cell 101, thereby causing the free layer 114a of the MTJ structure 114 to have an anti-parallel orientation with respect to the reference layer 114c of the MTJ structure to store the second data value (e.g., a logical '0') in the SOT MRAM cell 101.

To read a data value from the SOT MRAM cell 101, read conditions are applied across the MTJ structure 114 of the SOT MRAM cell 101 to read the resistive state of the MTJ structure 114. In some embodiments, the read conditions include applying a read voltage to the SL 102 and grounding the RWL 116, wherein the WWL 106 is electrically floating. Under such conditions, the first selector structure 108 may be turned "ON," while the second selector structure 110 remains "OFF." In such embodiments, the resistance of current traveling across the MTJ structure 114 is determined and corresponds to the stored data value on the SOT MRAM cell 101.

Figure 1C:
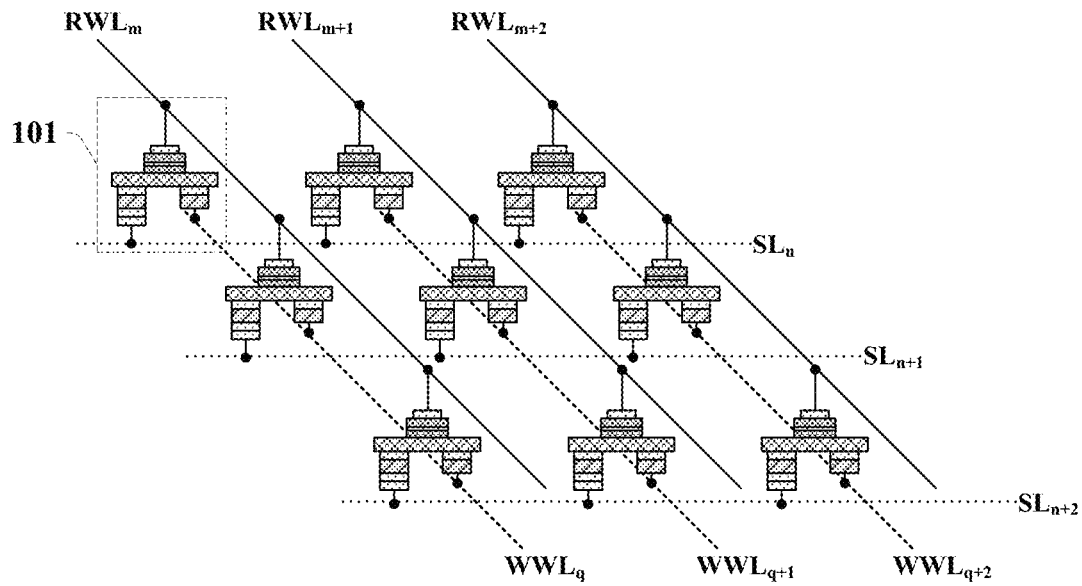

FIG. 1C illustrates a schematic 100C of some embodiments of an SOT MRAM array.

The schematic 100C includes many rows and columns of the SOT MRAM cells 101 of FIG. 1A. In some embodiments, only a portion of the SOT MRAM array is illustrated in FIG. 1C. For example, in some embodiments, despite the three illustrated rows and the three illustrated columns in the schematic 100C of FIG. 1C, more or less than three rows and three columns may be present in the SOT MRAM array.

Each SOT MRAM cell 101 is coupled to a SL (102 of FIG. 1B), a WWL (106 of FIG. 1B), and a RWL (116 of FIG. 1B), which are illustrated as lines in FIG. 1C for ease of illustration instead of as conductive wires as shown in FIG. 1B. Further, for ease of illustration, the SOT MRAM cells 101 are drawn two-dimensionally. In some embodiments, each SOT MRAM cell 101 is coupled to a RWL (e.g., $RWL_m$, $RWL_{m+1}$, or $RWL_{m+2}$), a SL (e.g., $SL_n$, $SL_{n+1}$, $SL_{n+2}$), and a WWL (e.g., $WWL_q$, $WWL_{q+1}$, $WWL_{q+2}$). The subscripts correspond to the column or row number, wherein each respective letter (e.g., "m," "n," "q") is an integer variable. An SOT MRAM cell 101 may be individually accessed to perform a write operation by accessing one of the SLs (e.g., $SL_n$, $SL_{n+1}$, $SL_{n+2}$) and one of the WWLs (e.g., $WWL_q$, $WWL_{q+1}$, $WWL_{q+2}$) or to perform a read operation by accessing one of the SLs (e.g., $SL_n$, $SL_{n+1}$, $SL_{n+2}$) and one of the RWLs (e.g., $RWL_m$, $RWL_{m+1}$, or $RWL_{m+2}$). In some embodiments, the first and second selector structures (108, 110 of FIG. 1A) may prevent other SOT MRAM cells 101 from changing data states while the SOT MRAM cell 101 to be written to or read from is accessed.

Figure 1D:
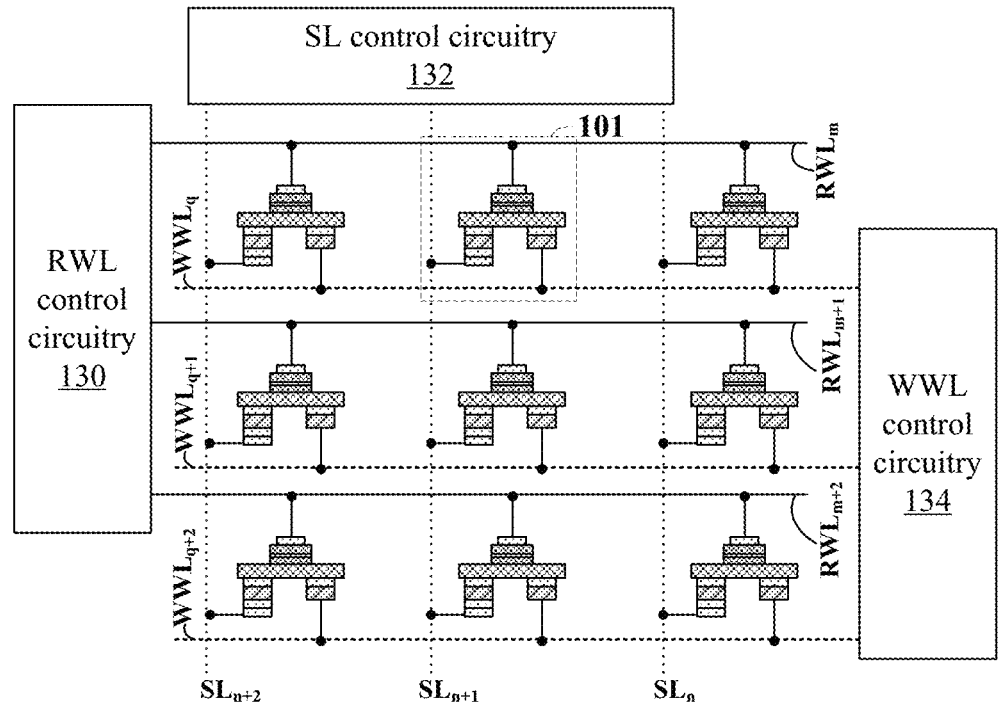

FIG. 1D illustrates a schematic 100D of some embodiments of an SOT MRAM array, wherein the SL, WWL, and RWL are respectively coupled to control circuitry.

In some embodiments, the SLs (e.g., $SL_n$, $SL_{n+1}$, $SL_{n+2}$) are controlled by and coupled to SL control circuitry 132; the WWLs (e.g., $WWL_q$, $WWL_{q+1}$, $WWL_{q+2}$) are controlled by and coupled to WWL control circuitry 134; and the RWLs (e.g., $RWL_m$, $RWL_{m+1}$, or $RWL_{m+2}$) are controlled by and coupled to RWL control circuitry 130. In some embodiments, the SL control circuitry 132 is configured to apply a signal (e.g., current, voltage) to a specific SL; the RWL control circuitry 130 is configured to apply a signal (e.g., current, voltage) to a specific RWL; and the WWL control circuitry is configured to apply a signal (e.g., current, voltage) to a specific WWL. For example, to access the SOT MRAM cell 101 that is labeled in FIG. 1D to perform a write operation, the SL control circuitry 132 would selectively access the $SL_{n+1}$ and the WWL control circuitry 134 would selectively access the $WWL_q$. Similarly, to access the SOT MRAM cell 101 that is labeled in FIG. 1D to perform, for example, a read operation, the SL control circuitry 132 would selectively access the $SL_{n+1}$ and the RWL control circuitry 130 would selectively access the $RWL_m$. In some embodiments, the first and second selector structures (108, 110 of FIG. 1A) may prevent other SOT MRAM cells 101 from changing data states while the SOT MRAM cell 101 to be written to or read from is accessed.

Figure 2A:
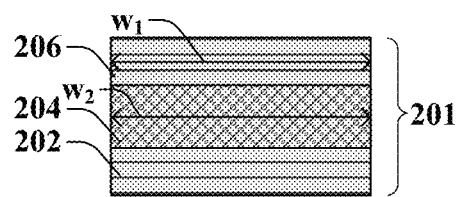
FIGS. 2A, 2B, and 2C illustrate cross-sectional views of various embodiments of a selector structure.
Figure 2B:
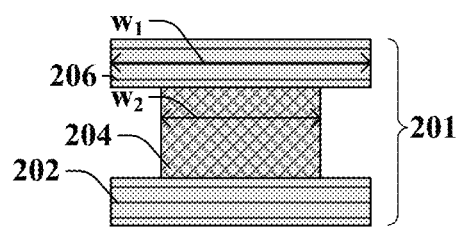
Figure 2C:
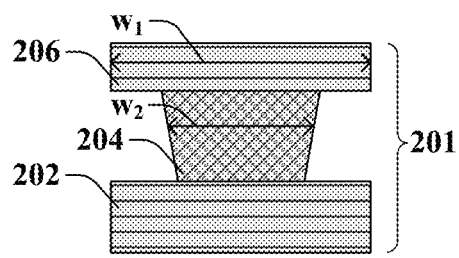

FIGS. 2A-2C illustrate cross-sectional views 200A-C of some embodiments of a selector structure.

As illustrated in cross-sectional view 200A of FIG. 2A, in some embodiments, a selector structure 201 comprises a switch layer 204 arranged between a bottom electrode 202 and a top electrode 206. In some embodiments, the bottom electrode 202 and the top electrode 206 may have a first width $w_1$ substantially equal to a second width $w_2$ of the switch layer 204. In some embodiments, the bottom electrode 202 and/or the top electrode 206 may be or comprise the contact vias (104 of FIG. 1A). In other embodiments, contact vias (104 of FIG. 1A) may be coupled to the bottom and top electrodes 202, 206. In some embodiments, the bottom electrode 202 and/or the top electrode 206 comprise, for example, titanium nitride, copper, tungsten, or some other suitable conductive material. Further, in some embodiments, the switch layer 204 comprises a material that may switch between "OFF" (e.g., insulating) and "ON" (e.g., conductive) when a voltage bias is applied across the switch layer 204 that is greater than a threshold voltage of the switch layer 204. For example, in some embodiments, the switch layer 204 of the selector structure 201 may comprise a phase change material (e.g., a chalcogenide such as germanium antimony tellurium), niobium oxide, copper germanium selenium, hafnium oxide, arsenic tellurium germanium silicon nitride, or some other suitable material. Further, in some embodiments, the selector structure 201 may be an example embodiment of the first selector structure (108) and/or the second selector structure (110) in FIG. 1A.

In some embodiments, the selector structure 201 has a low threshold voltage, thereby reducing power of the overall SOT MRAM device. For example, in some embodiments, the threshold voltage of the selector structure 201 is in a range of between approximately 0.3 volts and approximately 3 volts. In some other embodiments, the threshold voltage of the selector structure 201 may be less than 0.3 volts. Further, in some embodiments, the selector structure 201 has a low switching speed, thereby increasing read and write speeds of the overall SOT MRAM device. For example, in some embodiments, the switching speed of the selector structure 201 is in a range of between approximately 5 nanoseconds and approximately 1000 nanoseconds. Further, in some embodiments, the resistance while the selector structure 201 is "ON" is low, thereby increasing reliability of the overall SOT MRAM device. For example, if the selector structure 201 is turned "ON" during a read operation, the stored data value in the MTJ structure (114 of FIG. 1A) may be based on a resistance reading of the MTJ structure (114 of FIG. 1A). If the selector structure 201 has a high resistance, the readability of the resistance of the MTJ structure (114 of FIG. 1A) may unreliable and/or inaccurate. In some embodiments, for example, the resistance of the selector structure 201 while the selector structure 201 is "ON" may be in a range of between approximately 1 kilohms and approximately 30 kilohms. Thus, at least voltage threshold, switching speed, and resistance while "ON" are parameters to consider in designing the selector structure 201 to optimize the overall SOT MRAM device performance.

FIG. 2B illustrates cross-sectional view 200B of some alternative embodiments of the selector structure 201. In some embodiments, the second width $w_2$ of the switch layer 204 is less than the first width $w_1$ of the bottom electrode 202 and the top electrode 206.

FIG. 2C illustrates cross-sectional view 200C of some other alternative embodiments of the selector structure 201. In some embodiments, the second width $w_2$ of the switch layer 204 is less than the first width $w_1$ of the bottom electrode 202 and the top electrode 206. Further, in some embodiments, the second width $w_2$ of the switch layer 204 may vary throughout the height of the switch layer 204. In some embodiments, the switch layer 204 may resemble a trapezoidal-like shape.

Figure 3A:
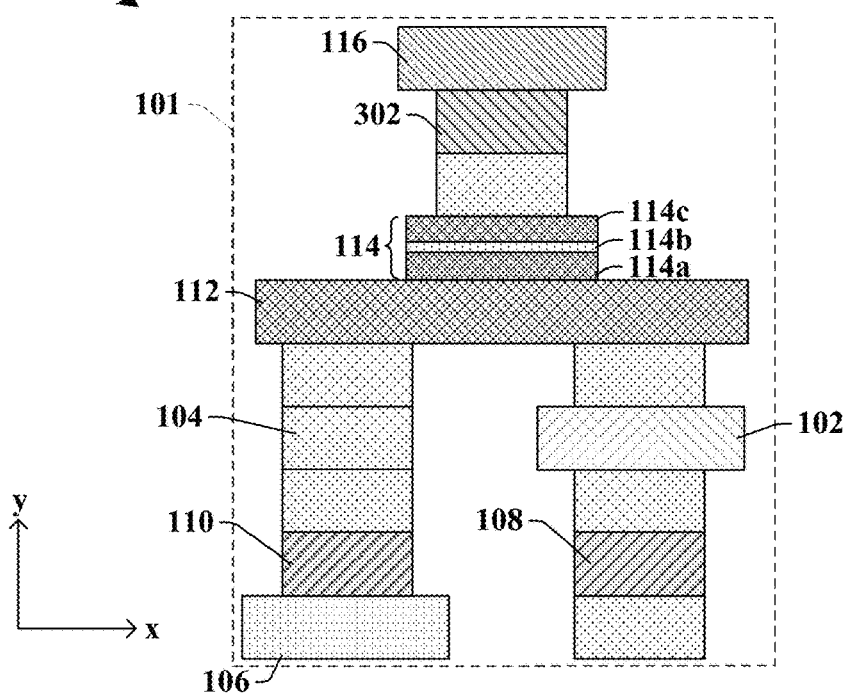
FIGS. 3A and 3B illustrate various views of some additional embodiments of an SOT MRAM device comprising an MTJ structure over an SOT layer having a first selector structure beneath an SL and the SOT layer, a second selector structure between a WWL and the SOT layer, and a third selector structure between a read write line (RWL) and the MTJ structure.

FIG. 3A illustrates a cross-sectional view 300A of some embodiments of an SOT MRAM cell comprising an MTJ structure coupled to a RWL, a WWL, and a SL and comprising first, second, and third selector structures.

In some embodiments, an SOT MRAM cell 101 comprises a first selector structure 108, a second selector structure 110, and a third selector structure 302. In such embodiments, the first selector structure 108 may be arranged below the SL 102 and below the SOT layer 112. Thus, in some embodiments, although the first selector structure 108 is present in the SOT MRAM cell 101, the first selector structure 108 may not be active. In other words, in such embodiments, the first selector structure 108 may not influence whether current travels between the SL 102 and the SOT layer 112. In some embodiments, the first selector structure 108 may be present although not active due to cost savings during manufacturing.

Further, in some embodiments, the SOT MRAM cell 101 comprises a third selector structure 302. In some embodiments, the third selector structure 302 may be arranged between the RWL 116 and the MTJ structure 114. Thus, the third selector structure 302 may have a threshold voltage and allows current to travel between the RWL 116 and the MTJ structure 114 when the threshold voltage of the third selector structure 302 is exceeded. In some embodiments, the third selector structure 302 may be a same type of selector structure as the second selector structure 110, and thus, comprise a same structure (e.g., materials, thickness, etc.) as the second selector structure 110. In other embodiments, the third selector structure 302 may be a different type of selector structure than the second selector structure 110, and thus, comprise a different structure (e.g., materials, thickness, etc.) than the second selector structure 110.

In the SOT MRAM cell 101 of FIG. 3A, to perform a write operation, such as to write a first data value (e.g., a logical '1') onto the SOT MRAM cell 101, a write voltage is applied to the SL 102, the WWL 106 is grounded, and the RWL 116 is electrically floating. Under such conditions, the second selector structure 110 is turned "ON" or made conductive, whereas the third selector structure 302 remains "OFF." Thus, current is only applied to the SOT layer 112 and not across the MTJ structure 114.

Figure 3B:
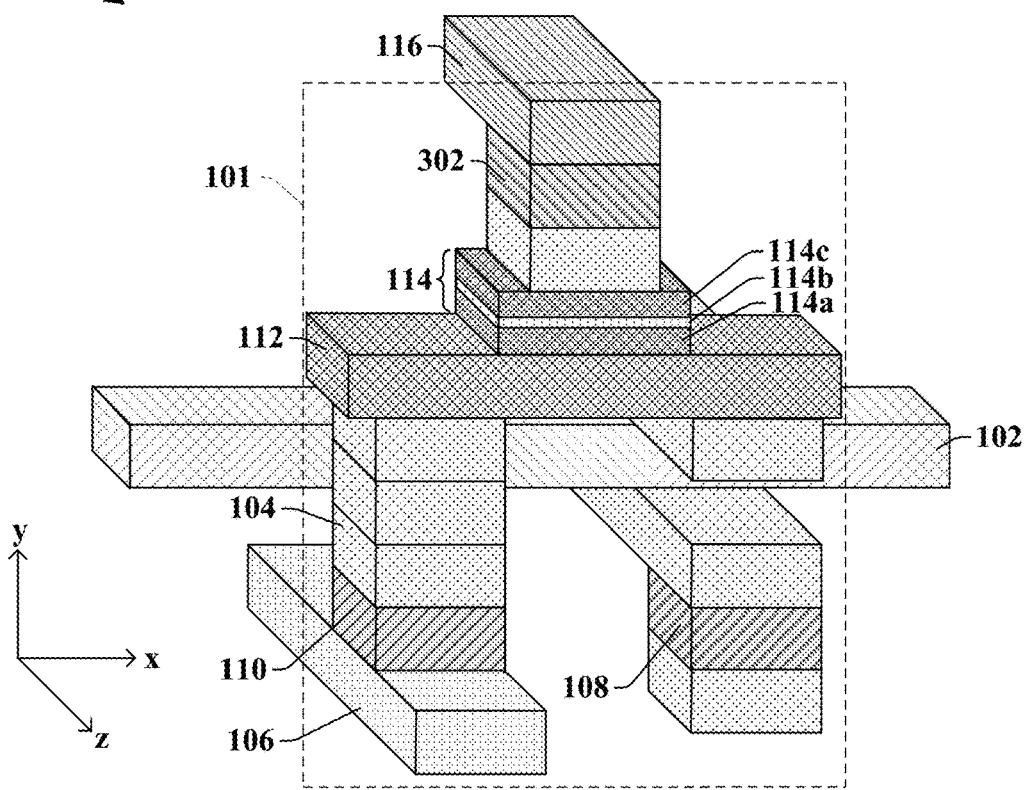

In the SOT MRAM cell 101 of FIG. 3B, to perform a read operation, a read voltage is applied to the RWL 116, the SL 102 is grounded, and the WWL 106 is electrically floating. Under such conditions, the third selector structure 302 is turned "ON" or made conductive, whereas the second selector structure 110 remains "OFF." Thus, current travels across the MTJ structure 114, and the resistive state that corresponds to a stored data value may be determined to read the SOT MRAM cell 101. In such embodiments, current may flow across the MTJ structure 114 unidirectionally (e.g., in a positive second direction y or in a negative second direction y) during all read operations. Thus, in some embodiments, the third selector structure 302 may be or comprise a diode. In other embodiments, the third selector structure 302 may be or comprise one of the selector structures illustrated in FIGS. 2A-2C.

FIG. 3B illustrates a perspective view 300B of some embodiments corresponding to the cross-sectional view 300A of FIG. 3A.

Figure 4A:
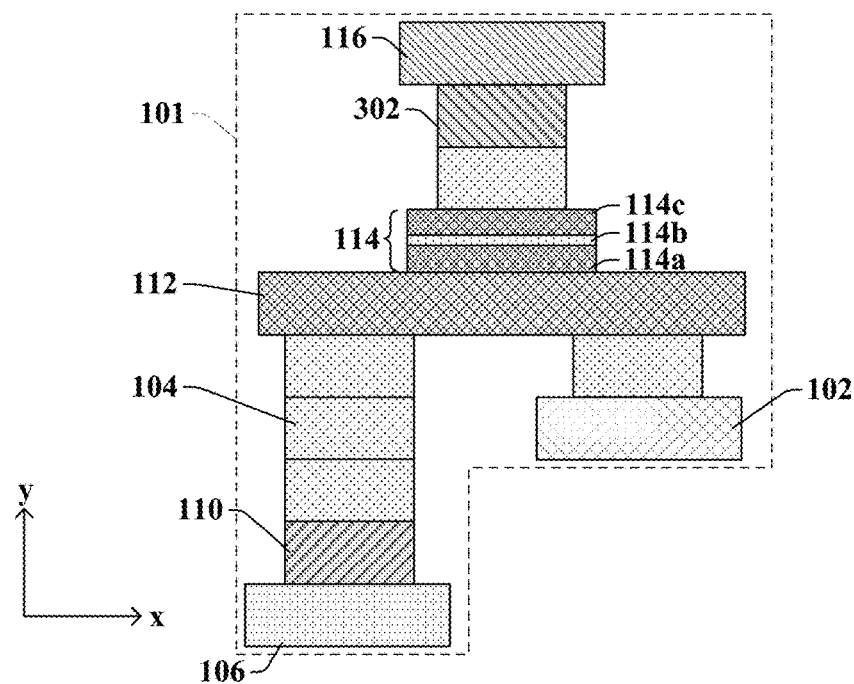
FIGS. 4A, 4B, 4C, and 4D illustrate various views and schematics of some additional embodiments of an SOT MRAM device comprising an MTJ structure over an SOT layer having a second selector structure between a WWL and the SOT layer and a third selector structure between a RWL and the MTJ structure.

FIG. 4A illustrates a cross-sectional view 400A of some alternative embodiments of an SOT MRAM cell comprising an MTJ structure coupled to a RWL, a WWL, and a SL and comprising first, second, and third selector structures.

In some embodiments, the first selector structure (108 of FIG. 3A) and/or contact vias 104 arranged below the SL 102 are removed from the SOT MRAM cell 101 during manufacturing. Thus, in some embodiments, the SOT MRAM cell 101 comprises the second selector structure 110 and the third selector structure 302, and the SOT MRAM cell 101 does not comprise a first selector structure (108 of FIG. 3A) arranged below the SL 102. In such embodiments, the size of the SOT MRAM cell 101 is reduced, but the manufacturing costs involved in removing the first selector structure (108 of FIG. 3A) may increase. In yet other embodiments, during manufacturing, a first selector structure (108 of FIG. 3A) may not even be formed.

Figure 4B:
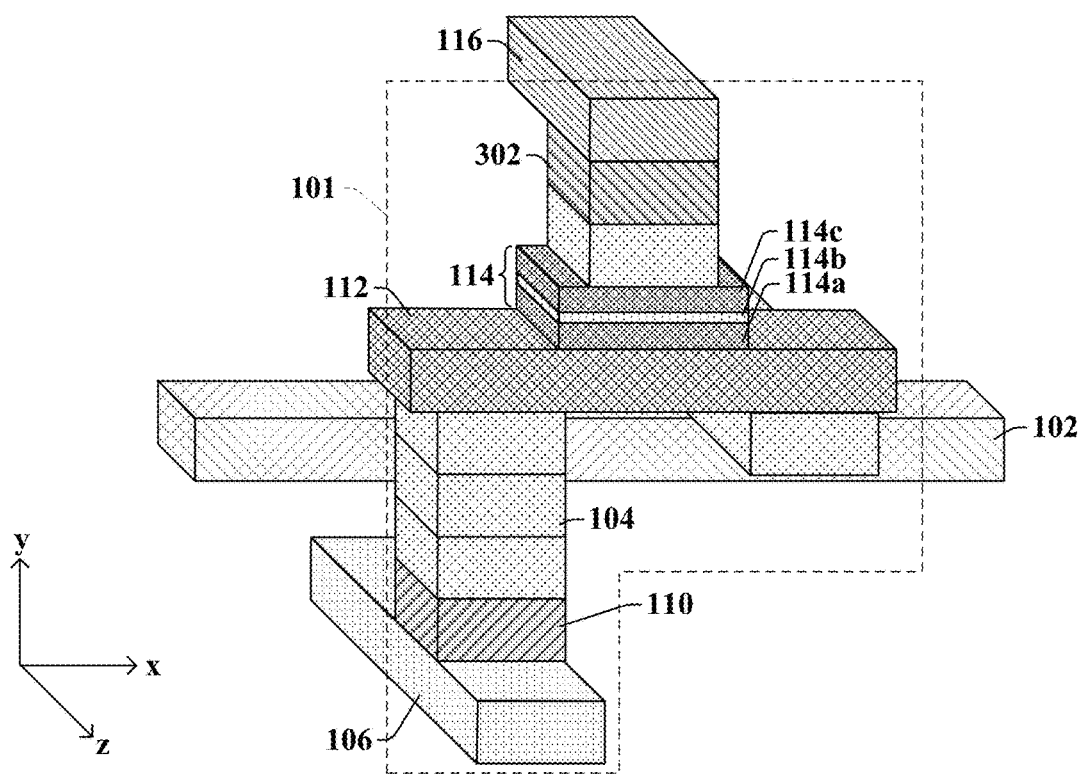

FIG. 4B illustrates a perspective view 400B of some embodiments corresponding to the cross-sectional view 400A of FIG. 4A.

Figure 4C:
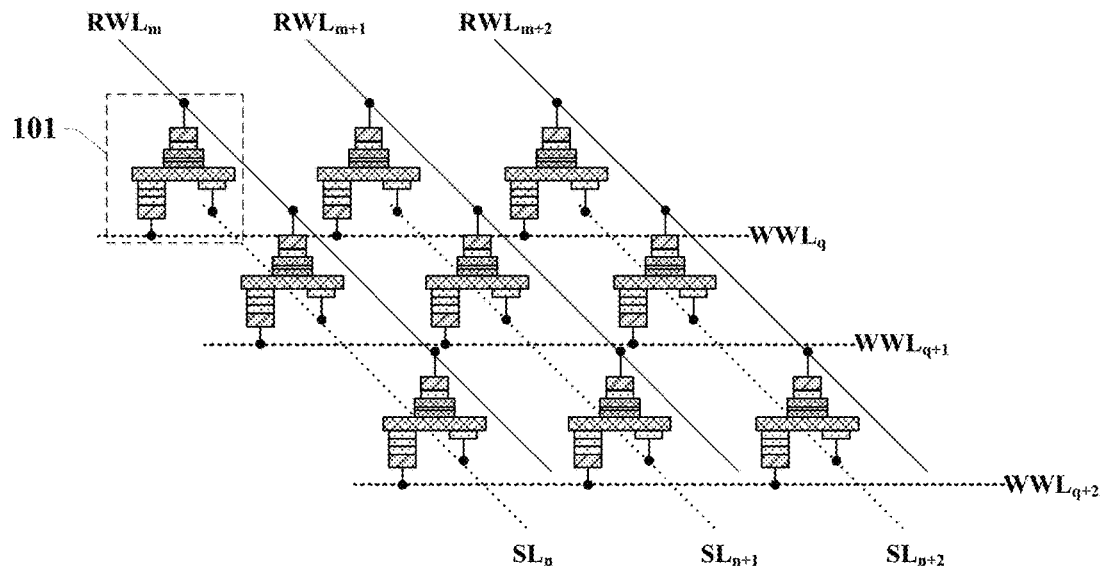

FIG. 4C illustrates a schematic 400C of some embodiments of an SOT MRAM array comprising the SOT MRAM cell 101 of FIG. 4A.

Figure 4D:
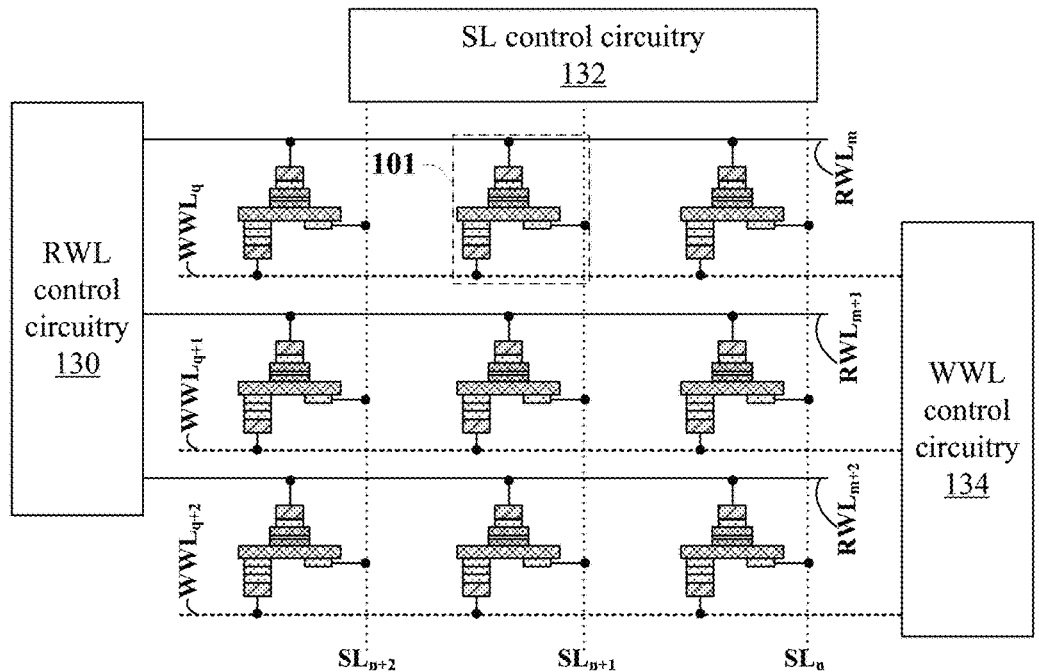

FIG. 4D illustrates a schematic 400D of some embodiments of an SOT MRAM array comprising the SOT MRAM cell 101 of FIG. 4A, wherein the SL, WWL, and RWL are respectively coupled to control circuitry.

It will be appreciated that the schematic 400C of FIG. 4C and the schematic 400D of FIG. 4D may comprise similar features and characteristics as the schematic 100C of FIG. 1C and as the schematic 100D of FIG. 4D, respectively, except that the schematic 400C of FIG. 4C and the schematic 400D of FIG. 4D include the SOT MRAM cell 101 of FIG. 4A comprising the second and third selector structures 110, 302 of FIG. 4A.

Figure 5A:
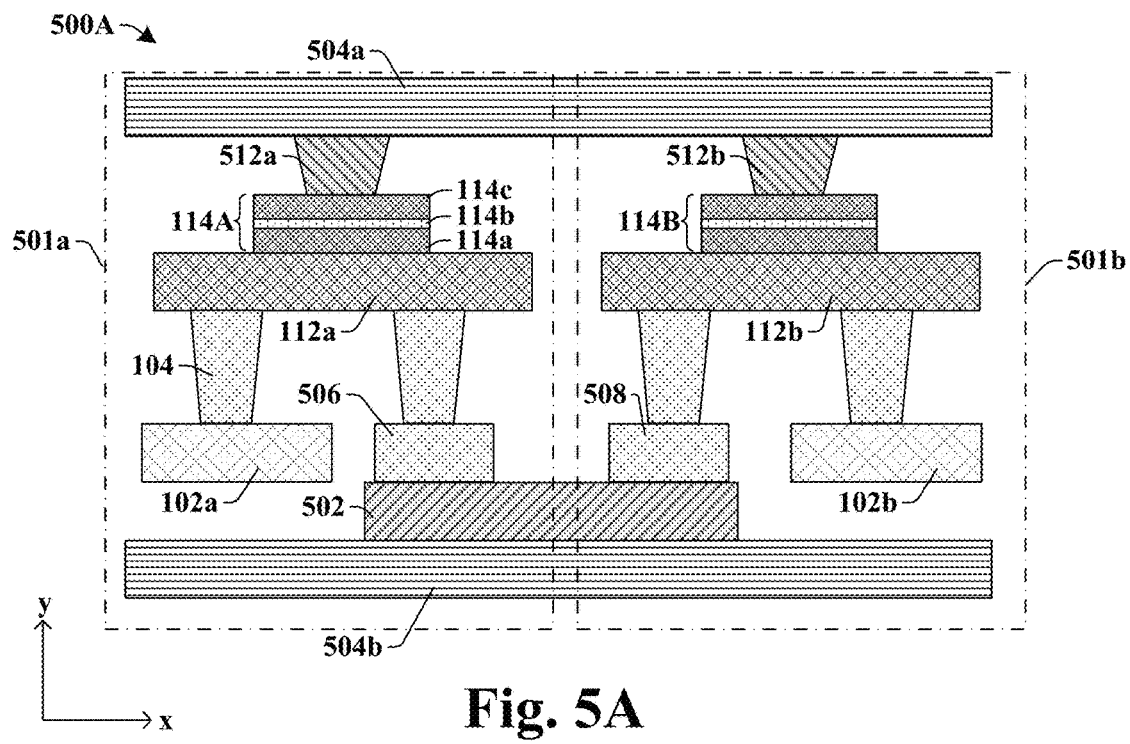
FIGS. 5A, 5B, 5C, 5D, and 5E illustrate various views and schematics of some additional embodiments of an SOT MRAM device comprising a first MTJ structure over a first SOT layer and a second MTJ structure over a second SOT layer, the first MTJ structure and the second MTJ structure both coupled to a first extended selector structure.

FIG. 5A illustrates a cross-sectional view 500A of some embodiments of a first SOT MRAM cell laterally beside a second SOT MRAM cell, wherein the first and second SOT MRAM cells share a first extended selector structure.

In some embodiments, a first SOT MRAM cell 501a and a second SOT MRAM cell 501b are arranged between and coupled to a first word line (WL) 504a and a second WL 504b. In some embodiments, the first SOT MRAM cell 501a comprises a first MTJ structure 114A, a first SOT layer 112a arranged below the first MTJ structure 114A, and a first upper selector structure 512a arranged between the first MTJ structure 114A and the first WL 504a. Similarly, in some embodiments, the second SOT MRAM cell 501b comprises a second MTJ structure 114B, a second SOT layer 112b arranged below the second MTJ structure 114B, and a second upper selector structure 512b arranged between the second MTJ structure 114B and the second WL 504b. The first MTJ structure 114A, the first SOT layer 112a, and the first upper selector structure 512a may be completely separated from the second MTJ structure 114B, the second SOT layer 112b, and the second upper selector structure 512b, respectively.

Further, in some embodiments, the first SOT MRAM cell 501a comprises a first source line (SL) 102a coupled to the first SOT layer 112a. In some embodiments, a contact via 104 couples the first SL 102a to the first SOT layer 112a, whereas in other embodiments, the first SL 102a is coupled directly to the first SOT layer 112a. Similarly, in some embodiments, a second SL 102b is coupled to the second SOT layer 112b in the second SOT MRAM cell 501b. In some embodiments, the first SOT layer 112a of the first SOT MRAM cell 501a and the second SOT layer 112b of the second SOT MRAM cell 501b are coupled to a first extended selector structure 502. Thus, the first extended selector structure 502 extends across the first and second SOT MRAM cells 501a, 501b. In some embodiments, the first extended selector structure 502 is coupled to the second WL 504b. In some embodiments, a first contact wire 506 directly contacts the first extended selector structure 502 and is arranged between the first SOT layer 112a and the second WL 504b. Similarly, in some embodiments, a second contact wire 508 directly contacts the first extended selector structure 502 and is arranged between the second SOT layer 112b and the second WL 504b. In some other embodiments, some other suitable conductive structures, such as contact vias, may directly contact the first extended selector structure 501 instead of the first and second contact wires 506, 508. Further, the first contact wire 506 is spaced apart from the second contact wire 508.

Because the first and second SOT MRAM cells 501a, 501b share the first WL 504a, the second WL 504b, and the first extended selector structure 502, an overall SOT MRAM device comprising the first and second SOT MRAM cells 501a, 501b may have an increased device density. Further, the first and second SOT MRAM cells 501a, 501b are able to share the first and second WLs 504a, 504b because of the presence of the selector structures (e.g., first upper selector structure 512a; second upper selector structure 512b; first extended selector structure 502). It will be appreciated that the first and second upper selector structures 512a, 512b may comprise the same or similar features as the third selector structure 302 of FIG. 4A and/or as the selector structure 201 in FIGS. 2A-2C. Further, it will be appreciated that the first extended selector structure 502 may comprise the same or similar features as the second selector structure 110 of FIG. 1A and/or as the selector structure 201 in FIGS. 2A-2C.

Figure 5B:
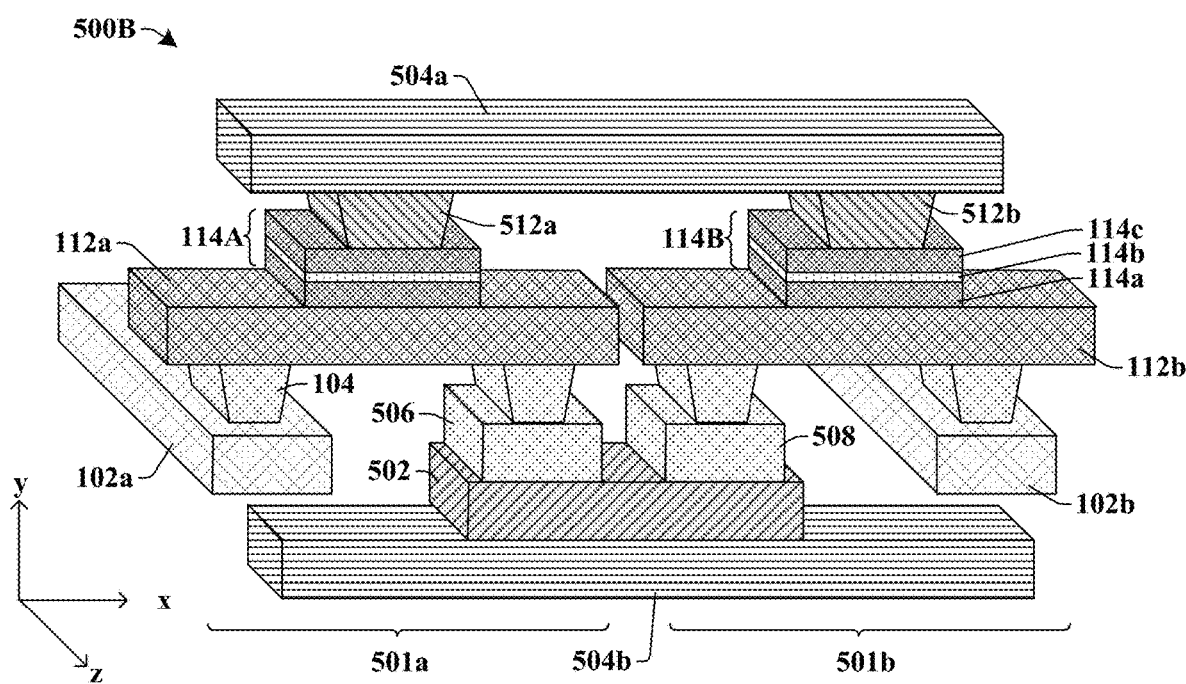

FIG. 5B illustrates a perspective view 500B of some embodiments corresponding to the cross-sectional view 500A of FIG. 5A.

In some embodiments, the first WL 504a and the second WL 504b extend in parallel. Further, in some embodiments, the first SL 102a and the second SL 102b extend in parallel. For example, as shown in the perspective view 500B of FIG. 5B, in some embodiments, the first and second WLs 504a, 504b extend in parallel in the first direction x, and in some embodiments, the first and second SLs 102a, 102b extend in parallel in the third direction z.

Figure 5C:
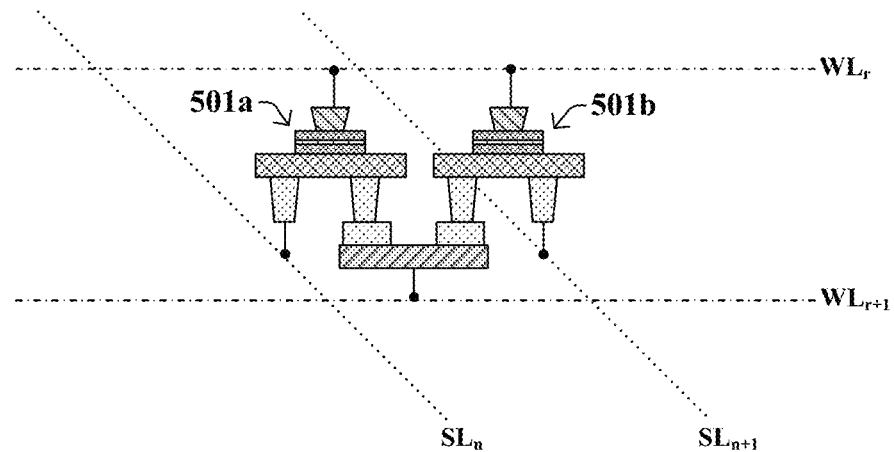

FIG. 5C illustrates a schematic 500C of some embodiments of the first and second SOT MRAM cells 501a, 501b of FIG. 5A coupled to SLs and WLs.

The schematic 500C includes two rows of WLs (e.g., $WL_r$, $WL_{r+1}$) and two rows of SLs (e.g., $SL_n$, $SL_{n+1}$) coupled to the first and second SOT MRAM cells 501a, 501b. Thus, in some embodiments, the schematic 500C is a portion of an SOT MRAM array comprising multiple first and second SOT MRAM cells 501a, 501b coupled to multiple WLs and SLs. Further, in the schematic 500C of FIG. 5C, the first SL (102a of FIG. 5A) is illustrated as line $SL_n$, and the second SL (102b of FIG. 5A) is illustrated as line $SL_{n+1}$ for ease of illustration. Further, in the schematic 500C of FIG. 5C, the first WL (504a of FIG. 5A) is illustrated as line $WL_r$, and the second WL (504b of FIG. 5A) is illustrated as line $WL_{r+1}$ for ease of illustration. The subscripts of the WLs and the SLs may correspond to the column or row number, wherein each respective letter (e.g., "n," "r") is an integer variable.

Figure 5D:
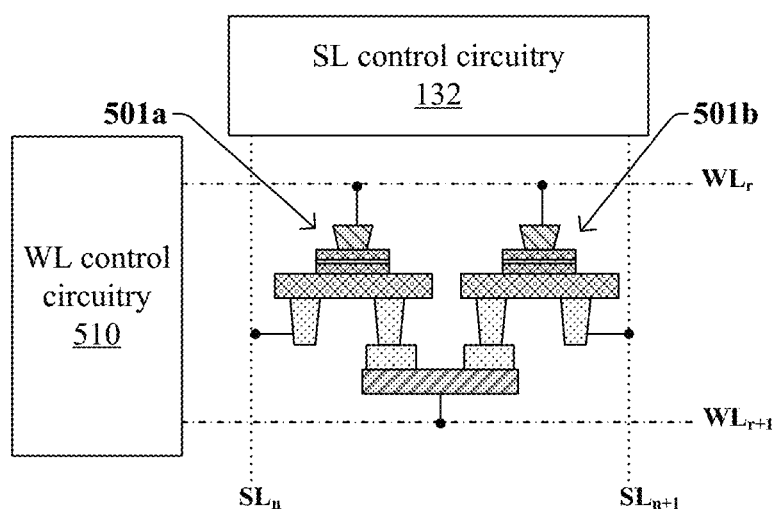

FIG. 5D illustrates a schematic 500D of some embodiments of the first and second SOT MRAM cells 501a, 501b coupled to SLs controlled by SL control circuitry and WLs controlled by WL control circuitry.

In some embodiments, the SLs (e.g., $SL_n$, $SL_{n+1}$) are controlled by and coupled to SL control circuitry 132; and the WLs (e.g., $WL_r$, $WL_{r+1}$) are controlled by and coupled to WL control circuitry 510. In some embodiments, the SL control circuitry 132 is configured to apply a signal (e.g., current, voltage) to a specific SL; and the WL control circuitry 510 is configured to apply a signal (e.g., current, voltage) to a specific WL. For example, to access the first SOT MRAM cell 501a to perform a write operation, the SL control circuitry 132 would selectively access the $SL_n$ and the WL control circuitry 510 would selectively access the $WL_{r+1}$. Similarly, to access the first SOT MRAM cell 501a to perform, for example, a read operation, the SL control circuitry 132 would selectively access the $SL_n$ and the WL control circuitry 510 would selectively access the $WL_r$. In some embodiments, the second upper selector structure (512b of FIG. 5A) and the first extended selector structure (502 of FIG. 5A) prevent the second SOT MRAM cell 501b from changing data states while the first SOT MRAM cell 501a to be written to or read from is accessed.

Figure 5E:
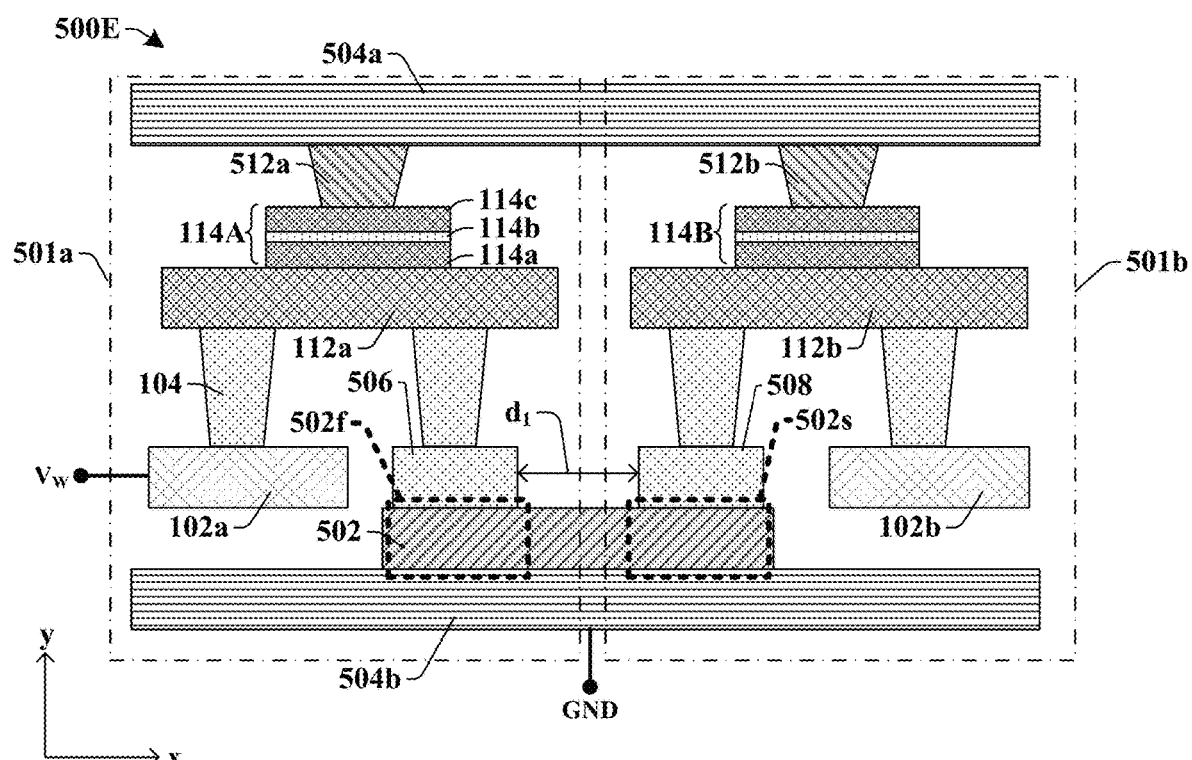

FIG. 5E illustrates a cross-sectional view 500E of some embodiments of first and second SOT MRAM cells sharing a first extended selector structure during a write operation. The cross-sectional view 500E of FIG. 5E may correspond to the cross-sectional view 500A of FIG. 5A, in some embodiments.

During a write operation to write a first data value (e.g., a logical '1') onto the first MTJ structure 114A of the first SOT MRAM cell 501a, for example, the first SL 102a and the second WL 504b may be selected by control circuitry, while the first WL 504a and the second SL 102b are electrically floating. In some embodiments, the SL control circuitry (132 of FIG. 5D) may apply a write voltage $V_w$ to the first SL 102a, and the WL control circuitry (510 of FIG. 5D) may ground GND the second WL 504b. Due to the voltage bias applied across the first extended selector structure 502 from the first SL 102a and the second WL 504b, a first portion 502f of the first extended selector structure 502 arranged directly between the first contact wire 506 and the second WL 504b may be turned "ON" to allow current to flow through the first portion 502f of the first extended selector structure 502. Such current is also applied across the first SOT layer 112a to induce an overall parallel orientation in the first MTJ structure 114A between the free layer 114a and the reference layer 114c to write the first data value (e.g., a logical '1') onto the first MTJ structure 114A.

Because the second SL 102b is electrically floating, a threshold voltage of the first extended selector structure 502 at a second portion 502s of the first extended selector structure 502 is not exceeded, and thus, the second portion 502s of the first extended selector structure 502 is "OFF" or not conductive. The second portion 502s of the first extended selector structure 502 is arranged directly between the second SOT layer 112b and the second WL 504b. Because the second portion 502s of the first extended selector structure 502 remains "OFF" while the first portion 502f of the first extended selector structure 502 is "ON," the first SOT MRAM cell 501a is written to while the second SOT MRAM cell 501b remains unchanged. Further, because the first WL 504a is electrically floating, the first upper selector structure 512a and the second upper selector structure 512b remain "OFF."

In some embodiments, to ensure that the first portion 502f of the first extended selector structure 502 and the second portion 502s of the first extended selector structure 502 may be selectively turned "ON" (i.e., one of the first portion 502f or second portion 502s is "ON" while the other one of the first portion 502f or second portion 502s is "OFF"), a minimum distance is kept between the first contact wire 506 and the second contact wire 508 are illustrated as a first distance di in FIG. 5E. In some embodiments, for example, the first distance di may be greater than about 20 nanometers. It will be appreciated that other values of the first distance di are also within the scope of the disclosure.

Further, in some other embodiments, it will be appreciated that the first portion 502f and the second portion 502s of the first extended selector structure 502 may be spaced apart from one another.

Further, in some embodiments, to write a second data value (e.g., a logical '0') onto the first MTJ structure 114A of the first SOT MRAM cell 501a, for example, the SL control circuitry (132 of FIG. 5D) may ground GND the first SL 102a, and the WL control circuitry (510 of FIG. 5D) may apply the write voltage $V_w$ to the second WL 504b. Thus, the first portion 502f of the first extended selector structure 502 is turned "ON," while the second portion 502s of the first extended selector structure 502, the first upper selector structure 512a, and the second upper selector structure 512b remain "OFF."

Even further, in some embodiments, to perform a read operation to read a stored data value from the first MTJ structure 114A of the first SOT MRAM cell 501a, for example, the SL control circuitry (132 of FIG. 5D) may ground GND the first SL 102a, and the WL control circuitry (510 of FIG. 5D) may apply a read voltage $V_r$ to the first WL 504a. Thus, the first upper selector structure 512a may be turned "ON" such that a voltage bias is applied across the first MTJ structure 114A, while the first portion 502f of the first extended selector structure 502, the second portion 502s of the first extended selector structure 502, and the second upper selector structure 512b remain "OFF." It will be appreciated that the aforementioned read and write operations for the first SOT MRAM cell 501a may be similarly applied to the second SOT MRAM cell 501b, and is within the scope of the disclosure.

Figure 6A:
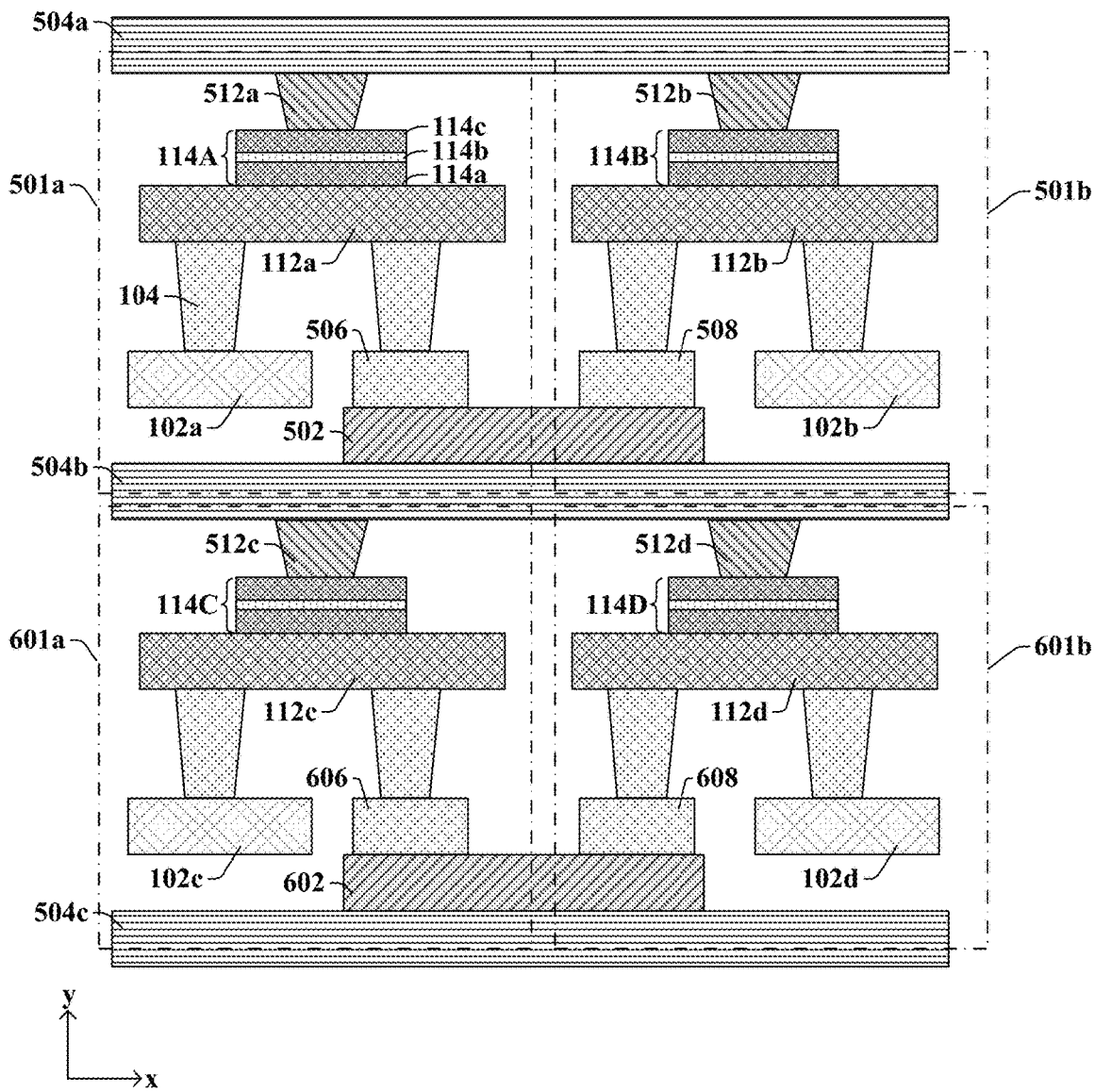
FIGS. 6A, 6B, 6C, 6D, and 6E illustrate various views and schematics of some additional embodiments of an SOT MRAM device comprising a first MTJ structure over a first SOT layer laterally next to a second MTJ structure over a second SOT layer and vertically above a third MTJ structure over a third SOT layer, wherein the first, second, and third MTJ structures are coupled to a same second WL.

FIG. 6A illustrates a cross-sectional view 600A of some embodiments of an SOT MRAM device comprising vertically and horizontally arranged SOT MRAM cells to reduce device size.

In some embodiments, an SOT MRAM device may further comprise a third SOT MRAM cell 601a arranged below the first SOT MRAM cell 501a. In some embodiments, the SOT MRAM device may further comprise a fourth SOT MRAM cell 601b arranged beside the third SOT MRAM cell 601a, below the second SOT MRAM cell 501b. In some embodiments, the third SOT MRAM cell 601a may comprise a third MTJ structure 114C arranged over a third SOT layer 112c, and the fourth SOT MRAM cell 601b may comprise a fourth MTJ structure 114D arranged over a fourth SOT layer 112d. In some embodiments, the third SOT layer 112c and the fourth SOT layer 112d may be coupled to a second extended selector structure 602. In some embodiments, a third contact wire 606 directly contacts the second extended selector structure 602, and a fourth contact wire 608 directly contacts the second extended selector structure 602. The second extended selector structure 602 may be arranged over a third WL 504c, wherein the third WL 504c extends in parallel with the first and second WLs 504a, 504b.

Further, in some embodiments, a third upper selector structure 512c of the third SOT MRAM cell 601a is arranged between and coupled to the second WL 504b and a third MTJ structure 114C of the third SOT MRAM cell 601a. Similarly, in such embodiments, a fourth upper selector structure 512d of the fourth SOT MRAM cell 601b is arranged between and coupled to the second WL 504b and a fourth MTJ structure 114D of the fourth SOT MRAM cell 601b. Thus, in some embodiments, the second WL 504b may control write operations for the first and second SOT MRAM cells 501a, 501b, for example, whereas the second WL 504b may also control read operations for the third and fourth SOT MRAM cells 601a, 601b, for example. In such embodiments, the WL control circuitry (510 of FIG. 5D) can still selectively access one SOT MRAM cell of the first, second, third, or fourth SOT MRAM cells 501a, 501b, 601c, 601d because of the first extended selector structure 502, the third upper selector structure 512c, and the fourth upper selector structure 512d. Thus, SOT MRAM cells may be vertically and horizontally arranged to reduce size of the overall SOT MRAM device.

Figure 6B:
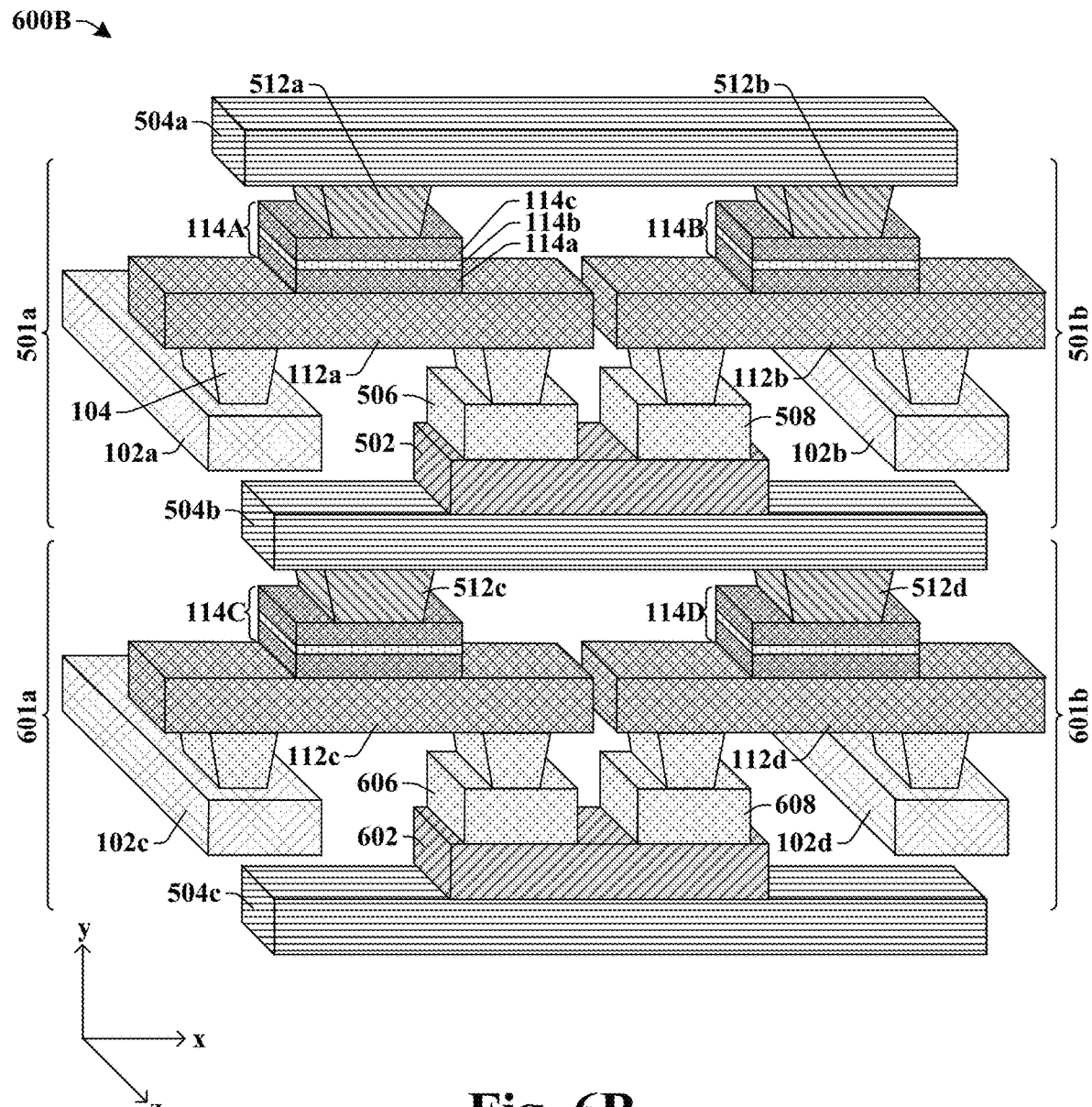

FIG. 6B illustrates a perspective view 600B of some embodiments corresponding to the cross-sectional view 600A of FIG. 6A.

Figure 6C:
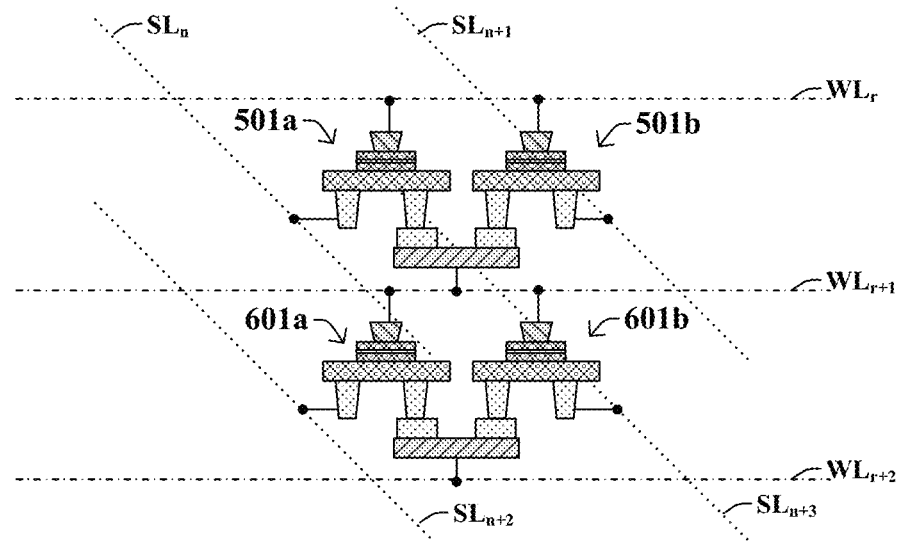

FIG. 6C illustrates a schematic 600C of some embodiments of the first, second, third, and fourth SOT MRAM cells 501a, 510b, 601a, 601b coupled to SLs and WLs.

It will be appreciated that the schematic 600C of FIG. 6C may be a portion of an SOT MRAM array, and thus, more than three WLs, more than four SLs, and/or more than four SOT MRAM cells may be present in the SOT MRAM array.

Figure 6D:
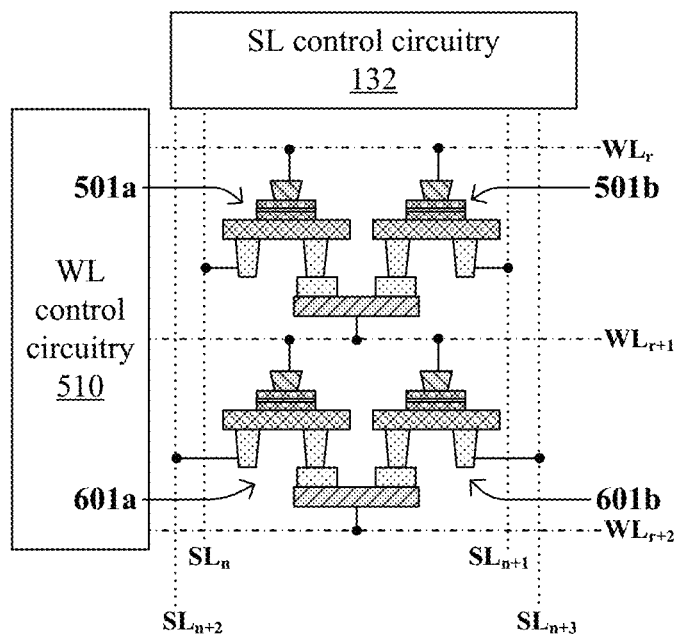

FIG. 6D illustrates a schematic 600D of some embodiments of the first, second, third, and fourth SOT MRAM cells 501a, 501b, 601a, 601b coupled to SLs controlled by SL control circuitry and WLs controlled by WL circuitry.

It will be appreciated that the WL control circuitry 510 may selectively apply a signal (e.g., current, voltage) to one of the WLs (e.g., $WL_r$, $WL_{r+1}$, $WL_{r+2}$), and the SL control circuitry 132 may selectively apply a signal (e.g., current, voltage) to one of the SLs (e.g., $SL_n$, $SL_{n+1}$, $SL_{n+2}$, $SL_{n+3}$) according to a read or write operation performed on one of the SOT MRAM cells (e.g., 501a, 501b, 601a, 601b).

Figure 6E:
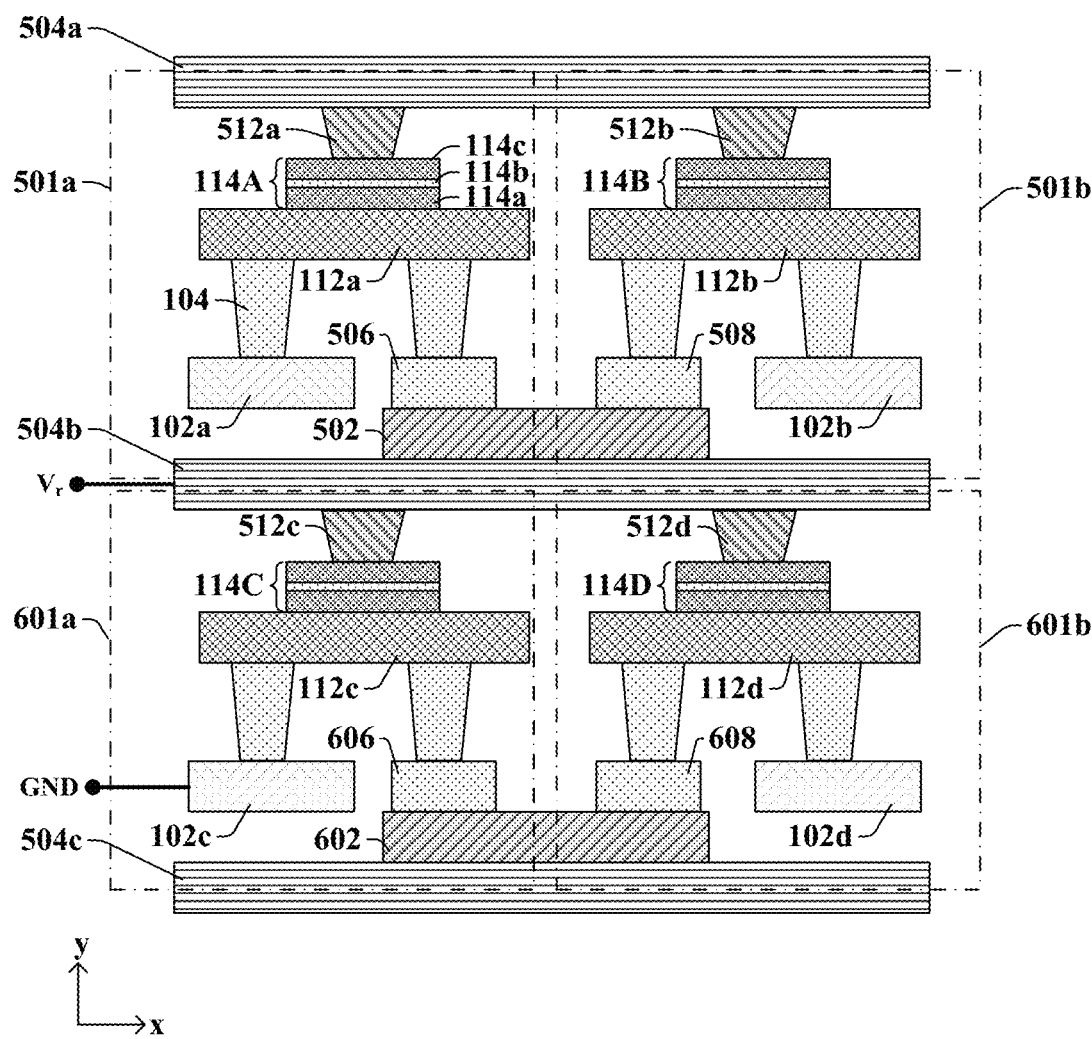

FIG. 6E illustrates a cross-sectional view 600E of some embodiments of an SOT MRAM device corresponding to the cross-sectional view 600A of FIG. 6A during a read operation of the third SOT MRAM cell 601a.

In some embodiments, to perform a read operation to read a stored data value from the third MTJ structure 114C of the third SOT MRAM cell 601a, for example, the SL control circuitry (132 of FIG. 6D) may ground GND the third SL 102c, and the WL control circuitry (510 of FIG. 6D) may apply a read voltage $V_r$ to the second WL 504b. Thus, the third upper selector structure 512c may be turned "ON" such that a voltage bias is applied across the third MTJ structure 114C, while the first extended selector structure 502 and the fourth upper selector structure 512d remain "OFF." The first extended selector structure 502 and the fourth upper selector structure 512d remain "OFF" because the first SL 102a, the second SL 102b, and the fourth SL 102d are electrically floating while the third SOT MRAM cell 601a is being accessed.

Further, it will be appreciated that each SOT MRAM cell (e.g., 501a, 501b, 601a, 601b) of FIG. 6E may be selectively accessed for read operations and write operations similar to the operating methods discussed with respect to FIG. 5E.

Figure 7:
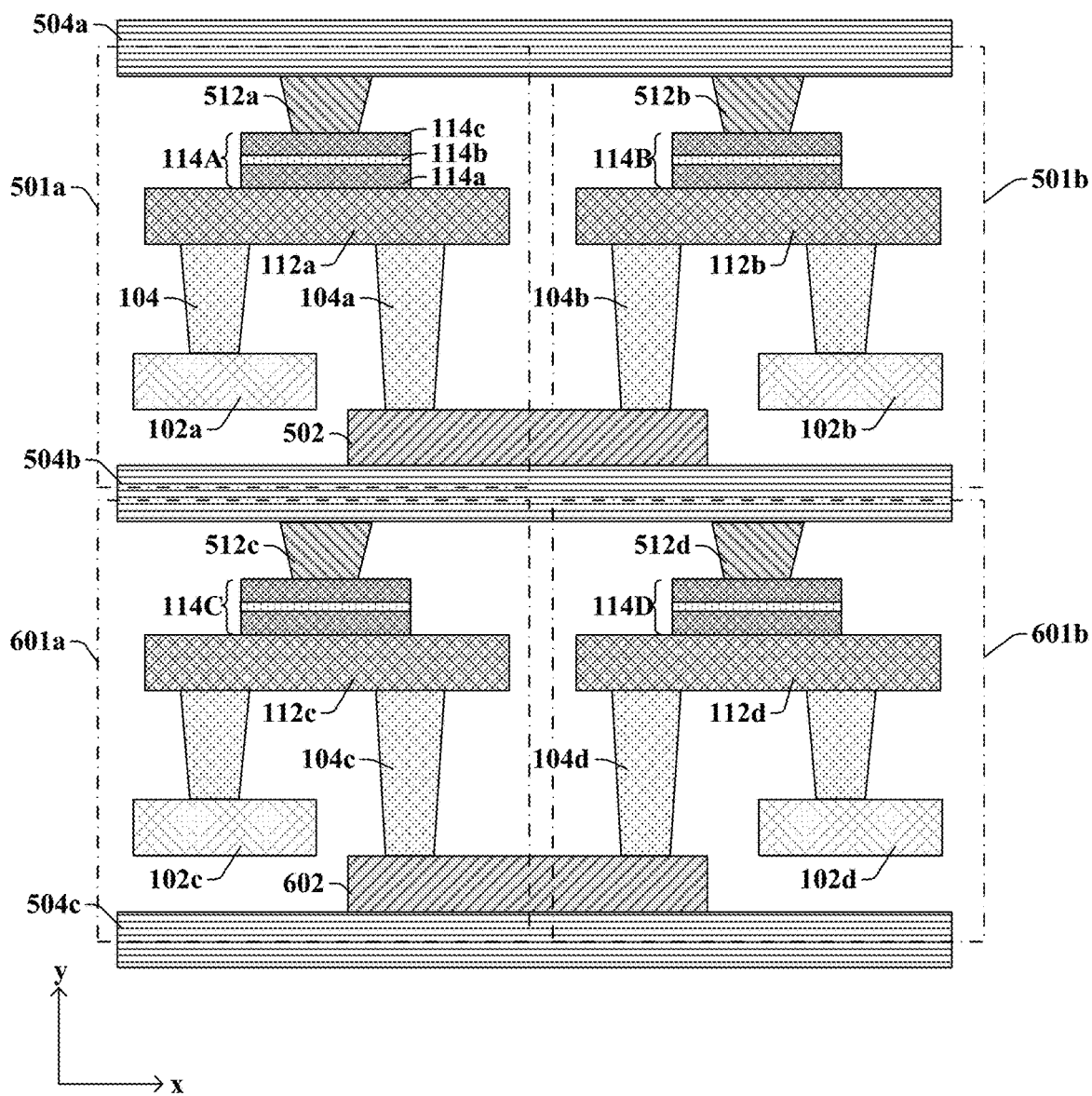
FIGS. 7 and 8 illustrate cross-sectional views of some alternative embodiments of an SOT MRAM device of FIG. 6A.

FIG. 7 illustrates a cross-sectional view 700 of some alternative embodiments of the SOT MRAM device illustrated in the cross-sectional view 600A of FIG. 6A.

In some embodiments, the first, second, third, and fourth contact wires 506, 508, 606, 608 may be omitted from the first, second, third, and fourth SOT MRAM cells 501a, 501b, 601a, 601b, respectively. In such embodiments, a first contact via 104a of the contact vias 104 may extend from the first SOT layer 112a to the first extended selector structure 502, and a second contact via 104b of the contact vias 104 may extend from the second SOT layer 112b to the first extended selector structure 502. Further, in such embodiments, a third contact via 104c of the contact vias 104 may extend from the third SOT layer 112c to the second extended selector structure 602, and a fourth contact via 104d of the contact vias 104 may extend from the fourth SOT layer 112d to the second extended selector structure 602.

Figure 8:
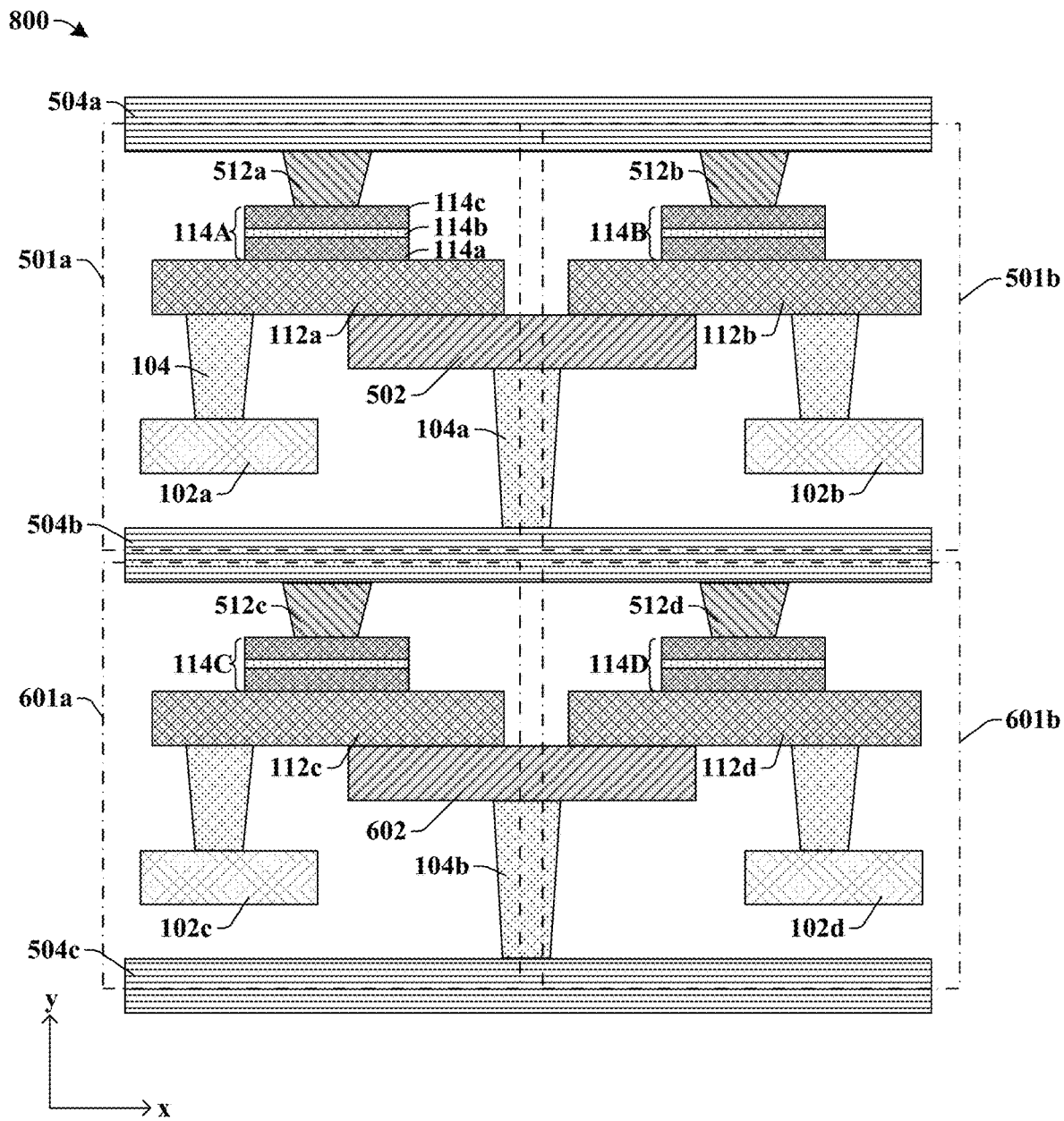

FIG. 8 illustrates a cross-sectional view 800 of some other alternative embodiments of the SOT MRAM device illustrated in the cross-sectional view 600A of FIG. 6A.

In some embodiments, the first, second, third, and fourth contact wires 506, 508, 606, 608 may be omitted from the first, second, third, and fourth SOT MRAM cells 501a, 501b, 601a, 601b, respectively. Further, in some embodiments, the first extended selector structure 502 may directly contact the first SOT layer 112a and the second SOT layer 112b. Similarly, in some embodiments, the second extended selector structure 602 may directly contact the third SOT layer 112c and the fourth SOT layer 112d. In such embodiments, a first contact via 104a of the contact vias 104 may extend from the first extended selector structure 502 to the second WL 504b, and a second contact via 104b of the contact vias 104 may extend from the second extended selector structure 602 to the third WL 504c. In such embodiments, turning "ON" portions (e.g., 502f, 502s of FIG. 5E) of the first and/or second extended selector structures 502, 602 may be harder to control in the SOT MRAM device of FIG. 8 than for FIG. 6E, for example. However, time and materials costs may be reduced by manufacturing the SOT MRAM device of FIG. 8 than that of FIG. 6E, for example.

FIGS. 9-22 illustrate cross-sectional views 900-2200 of some embodiments of a method of forming an SOT MRAM cell coupled to a RWL, a WWL, and a SL and comprising selector structures. Although FIGS. 9-22 are described in relation to a method, it will be appreciated that the structures disclosed in FIGS. 9-22 are not limited to such a method, but instead may stand alone as structures independent of the method.

Further, for ease of illustration, the cross-sectional views 900-2200 illustrate a single SOT MRAM cell of a SOT MRAM array. It will be appreciated that other SOT MRAM cells of the SOT MRAM array may be formed simultaneously with the single SOT MRAM cell and/or each of the other SOT MRAM cells may, for example, be similarly formed as illustrated for the single SOT MRAM cell.

Figure 9:
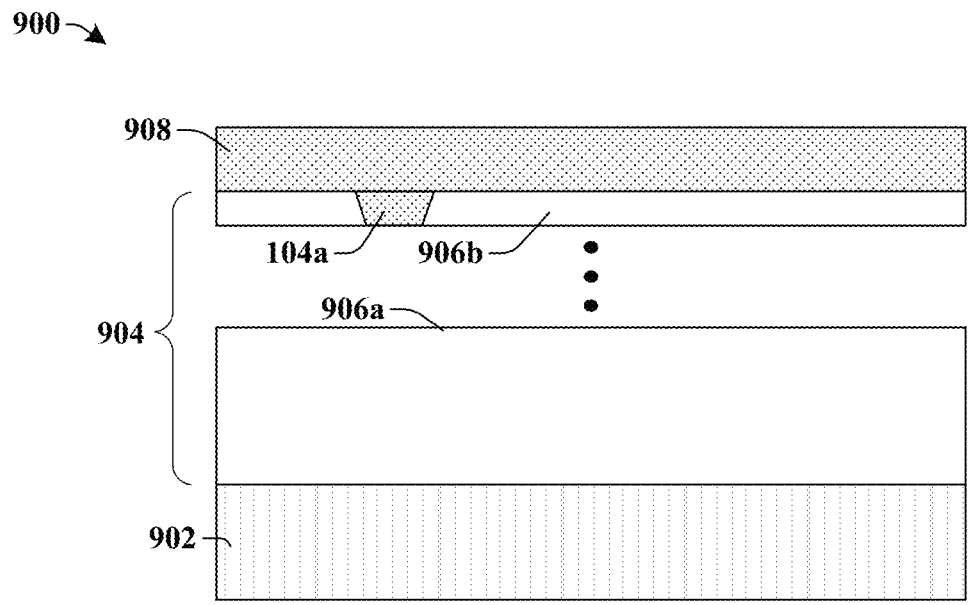
FIGS. 9-22 illustrate cross-sectional views of some embodiments of a method of forming a MRAM device having an MTJ structure over a SOT layer and coupled to two selector structures, a SL, a WWL, and a RWL.

As shown in cross-sectional view 900 of FIG. 9, an interconnect structure 904 is partially formed over a substrate 902. In some embodiments, the substrate 902 may be, for example, a bulk semiconductor substrate (e.g., bulk silicon), a silicon-on-insulator (SOI) substrate, or some other suitable substrate. The interconnect structure 904 comprises, in some embodiments, a first interconnect dielectric layer 906a arranged over the substrate 902, a second interconnect dielectric layer 906b over the first interconnect dielectric layer 906a, and a first contact via 104a arranged within the second interconnect dielectric layer 906b. In some other embodiments, the second interconnect dielectric layer 906b and/or the first contact via 104a may be omitted. Further, in some embodiments, as indicated by the vertically arranged "dots" between the first interconnect dielectric layer 906a and the second interconnect dielectric layer 906b, additional interconnect dielectric layers, contact vias, and/or contact wires may be arranged between the first and second interconnect dielectric layers 906a, 906b. Further, in some embodiments, semiconductor devices (not shown) may be arranged between the interconnect structure 904 and the substrate 902.

In some embodiments, a first conductive wire 908 may be formed over the interconnect structure 904. In some embodiments, the first conductive wire 908 defines a source line (SL). Thus, in some embodiments, the first conductive wire 908 may correspond to the SL 102 of FIG. 1A, for example. In some embodiments, the first contact via 104a and/or the additional contact vias and contact wires arranged within the interconnect structure 904 may form conductive pathways between semiconductor devices (not shown) disposed in the substrate 902 to the first conductive wire 908, for example.

In some embodiments, the first and/or second interconnect dielectric layers 906a, 906b of the interconnect structure 904 may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable dielectric. Further, in some embodiments, the first contact via 104a and/or the first conductive wire 908 may comprise a conductive material, such as, for example, tantalum, titanium, copper, tungsten, aluminum, or some other suitable conductive material.

In some embodiments, a process for forming the interconnect structure 904 of FIG. 9 comprises various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching).

Figure 10:
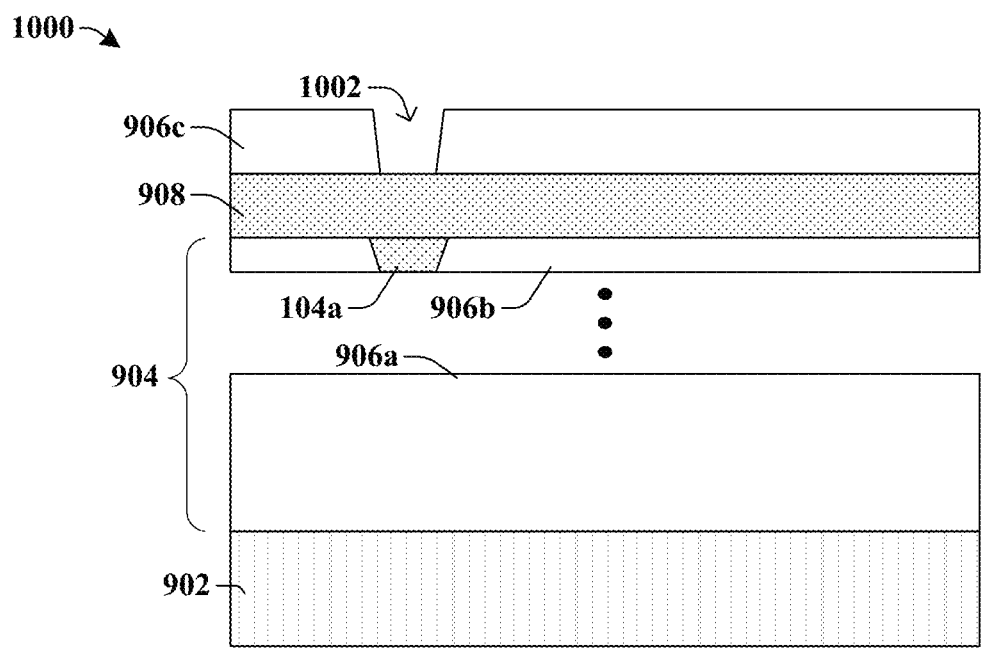
Figure 11:
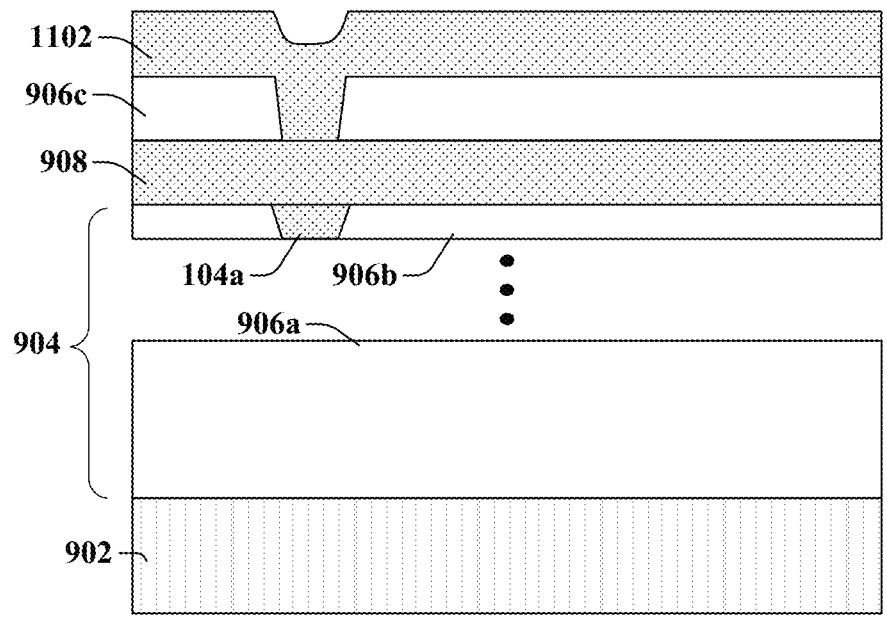

As shown in cross-sectional view 1000 of FIG. 10, in some embodiments, a third interconnect dielectric layer 906c is formed over the first conductive wire 908. In such embodiments, the third interconnect dielectric layer 906c may be formed through a deposition process (e.g., CVD, PVD, ALD, etc.). Further, in some embodiments, a first opening 1002 may be formed in the third interconnect dielectric layer 906c through various steps of patterning (e.g., photolithography/etching) and removal processes (e.g., wet etching, dry etching, CMP, etc.).

Figure 12:
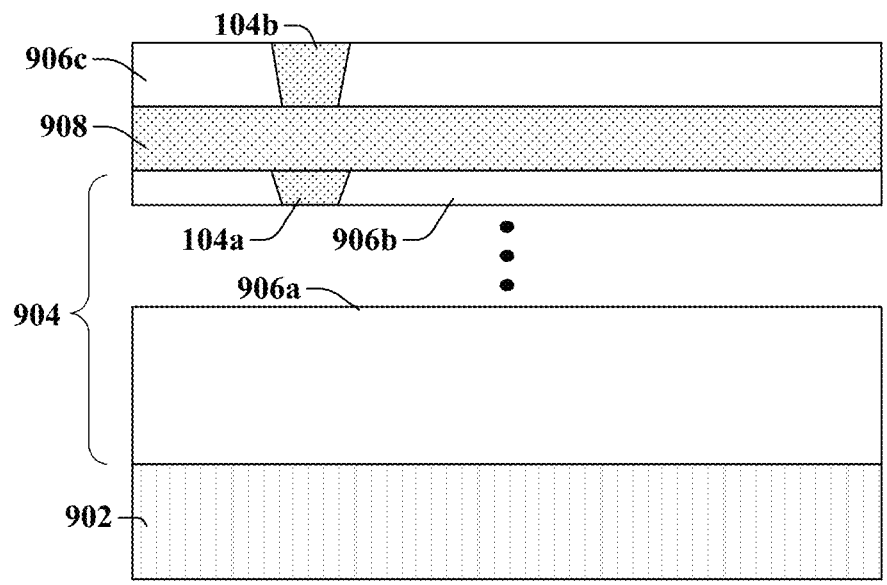

As shown in cross-sectional view 1100 of FIG. 12, in some embodiments, a first conductive material 1102 may be formed over the third interconnect dielectric layer 906c and within the first opening (1002 of FIG. 10). Thus, the first conductive material 1102 may directly contact the first conductive wire 908. In some embodiments, the first conductive material 1102 may be formed through a deposition process (e.g., CVD, PVD, ALD, sputtering, etc.).

As shown in cross-sectional view 1200 of FIG. 12, in some embodiments, a removal process is performed to remove the first conductive material (1102 of FIG. 11) from above the third interconnect dielectric layer 906c thereby forming a second contact via 104b coupled to the first conductive wire 908. In some embodiments, the removal process is conducted by way of CMP, whereas in other embodiments, the removal process may be conducted using an etch.

Figure 13:
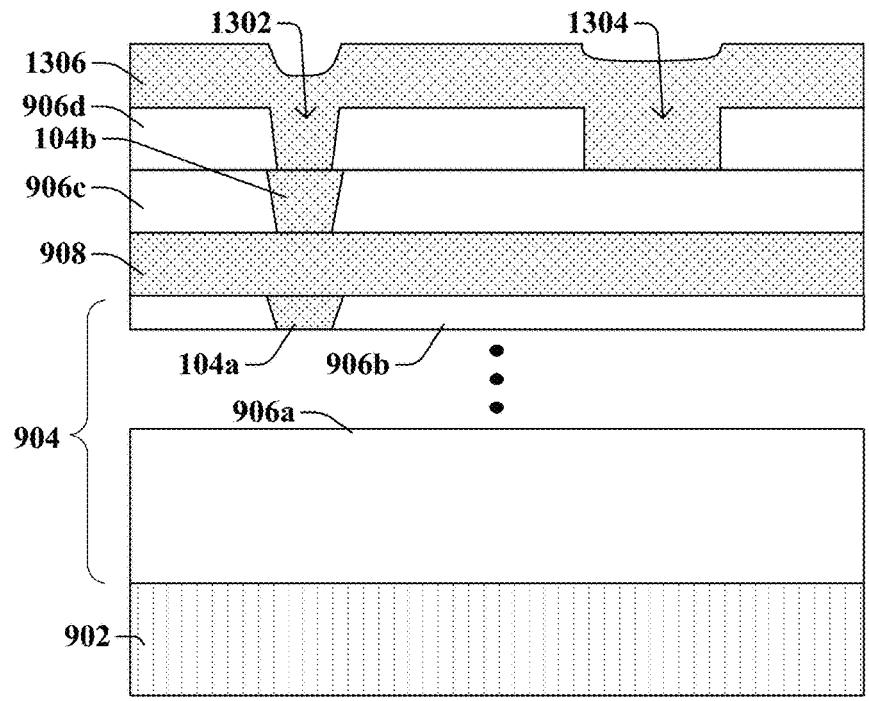

As shown in cross-sectional view 1300 of FIG. 13, in some embodiments, a fourth interconnect dielectric layer 906d is formed over the third interconnect dielectric layer 906c. Further, in some embodiments, a second opening 1302 is formed in the fourth interconnect dielectric layer 906d directly over the second contact via 104b, and a third opening 1304 is formed in the fourth interconnect dielectric layer 906d and is spaced apart from the second opening 1302. Further, a second conductive material 1306 may be formed over the fourth interconnect dielectric layer 906d and within the second and third openings 1302, 1304. It will be appreciated that in some embodiments, the formation of the fourth interconnect dielectric layer 906d, the second and third openings 1302, 1304, and the second conductive material 1306 in FIG. 13 may be formed using the same or similar processes as the formation of the third interconnect dielectric layer (906c of FIG. 10), the first opening (1002 of FIG. 10), and the first conductive material (1102 of FIG. 11), respectively.

Figure 14:
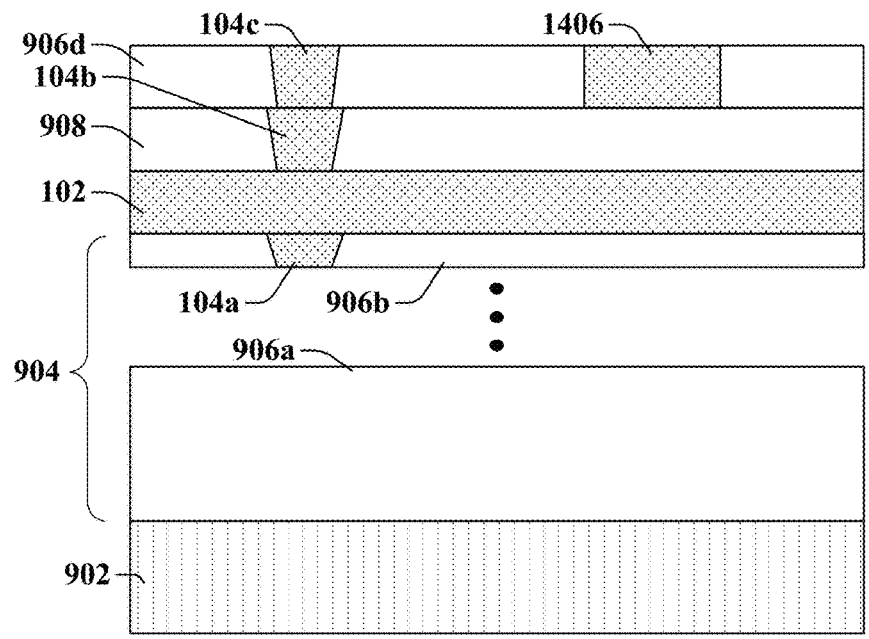

As shown in cross-sectional view 1400 of FIG. 14, in some embodiments, a removal process is performed to remove the second conductive material (1306 of FIG. 13) from above the fourth interconnect dielectric layer 906d thereby forming a second conductive wire 1406 and thereby forming a third contact via 104c coupled to the second contact via 104b. In some embodiments, the removal process is conducted by way of CMP, whereas in other embodiments, the removal process may be conducted using an etch. Further, in some embodiments, the second conductive wire 1406 defines a word write line (WWL). For example, in some embodiments, the second conductive wire 1406 may correspond to the WWL 106 of FIG. 1A. Further, in some embodiments, the second conductive wire 1406 may be coupled to semiconductor devices (not shown) within the substrate 902 by way of conductive pathways formed within the interconnect structure 904, for example.

Figure 15:
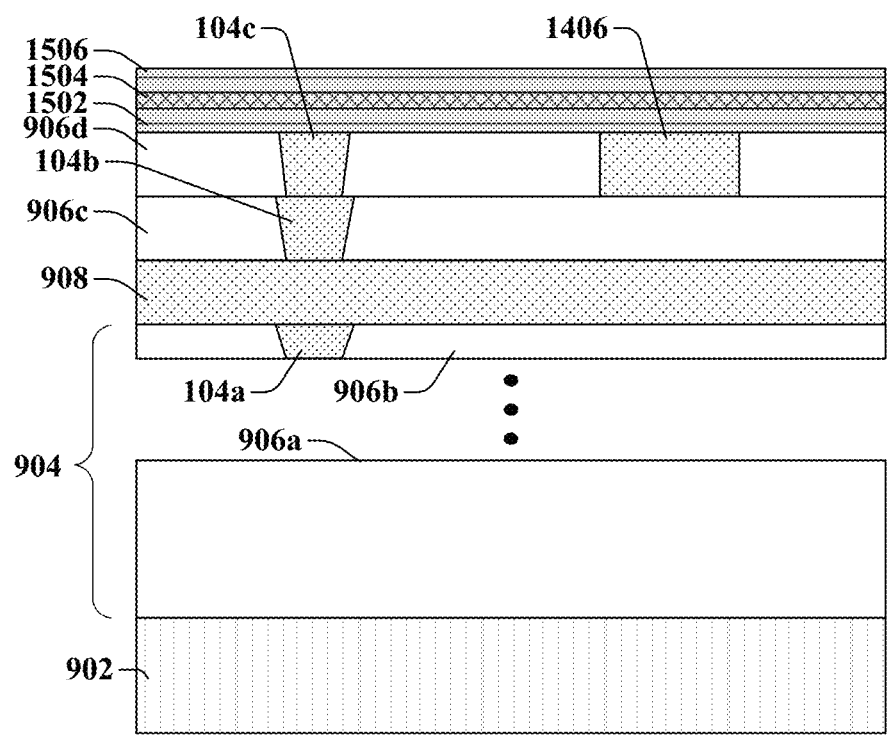

As shown in cross-sectional view 1500 of FIG. 15, in some embodiments, a first electrode layer 1502, a second electrode layer 1506, and a switch material 1504 arranged between the first electrode layer 1502 and the second electrode layer 1506 may be formed over the fourth interconnect dielectric layer 906d. In some embodiments, the first electrode layer 1502 is arranged over and directly contacts the third contact via 104c and the second conductive wire 1406. In some other embodiments, the first electrode layer 1502 and/or the second electrode layer 1506 may be omitted. In such other embodiments, the switch material 1504 may directly contact the third contact via 104c and/or the second conductive wire 1406.

In some embodiments, the first electrode layer 1502 and/or the second electrode layer 1506 comprise titanium, titanium nitride, copper, tungsten, or some other suitable conductive material. Further, in some embodiments, the switch material 1504 may comprise a material that may switch between "OFF" (e.g., insulating) and "ON" (e.g., conductive) when a voltage bias is applied across the switch material 1504 that is greater than a threshold voltage of the switch material 1504. For example, in some embodiments, the switch material 1504 may comprise a phase change material (e.g., a chalcogenide such as germanium antimony tellurium), niobium oxide, copper germanium selenium, hafnium oxide, arsenic tellurium germanium silicon nitride, or some other suitable material. In some embodiments, each of the first electrode layer 1502, the second electrode layer 1506, and the switch material may be formed by way of a deposition process (e.g., CVD, PVD, ALD, sputtering, etc.). In some embodiments, the switch material 1504 may be formed by a different deposition process than the first and second electrode layers 1502, 1506.

Figure 16:
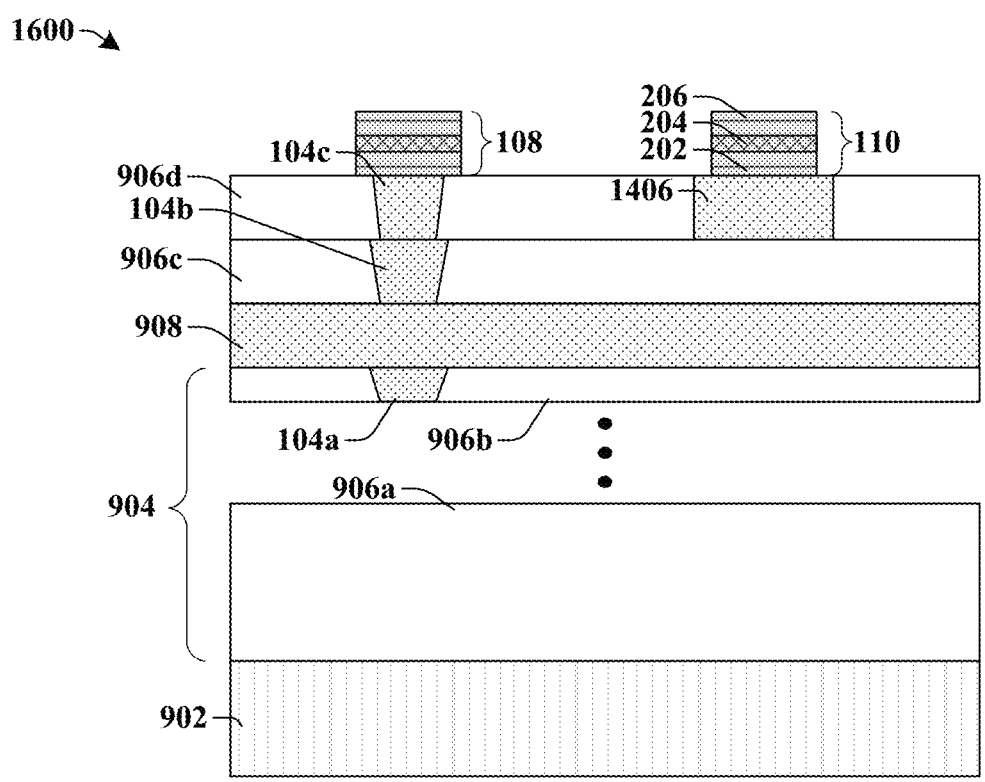

As shown in cross-sectional view 1600 of FIG. 16, in some embodiments, a removal process is performed to remove portions of the first electrode layer (1502 of FIG. 15), the second electrode layer (1506 of FIG. 15), and the switch material (1504 of FIG. 15) to form a first selector structure 108 of the third contact via 104c and a second selector structure 110 of the second conductive wire 1406. In some embodiments, the first and second selector structures 108, 110 comprise a bottom electrode 202, a switch layer 204, and a top electrode 206 respectively corresponding to the first electrode layer (1502 of FIG. 15), the switch material (1504 of FIG. 15), and the second electrode layer (1506 of FIG. 16). Thus, in some embodiments, the first and second selector structures 108, 110 comprise layers (202, 204, 206) comprising a same material and thickness, and therefore, the first and second selector structures 108, 110 comprise a same structure. In such embodiments, the first and second selector structures 108, 110 may comprise a same threshold voltage. It will be appreciated that in some other embodiments, the first and second selector structures 108, 110 may be formed separately and thus, have different structures and/or threshold voltages from one another.

In some the first and second selector structures 108, 110 may be formed through various steps comprising deposition processes (e.g., PVD, CVD, ALD, sputtering, etc.), removal processes (e.g., wet etching, dry etching, chemical mechanical planarization (CMP), etc.), and/or patterning processes (e.g., photolithography/etching).

Figure 17:
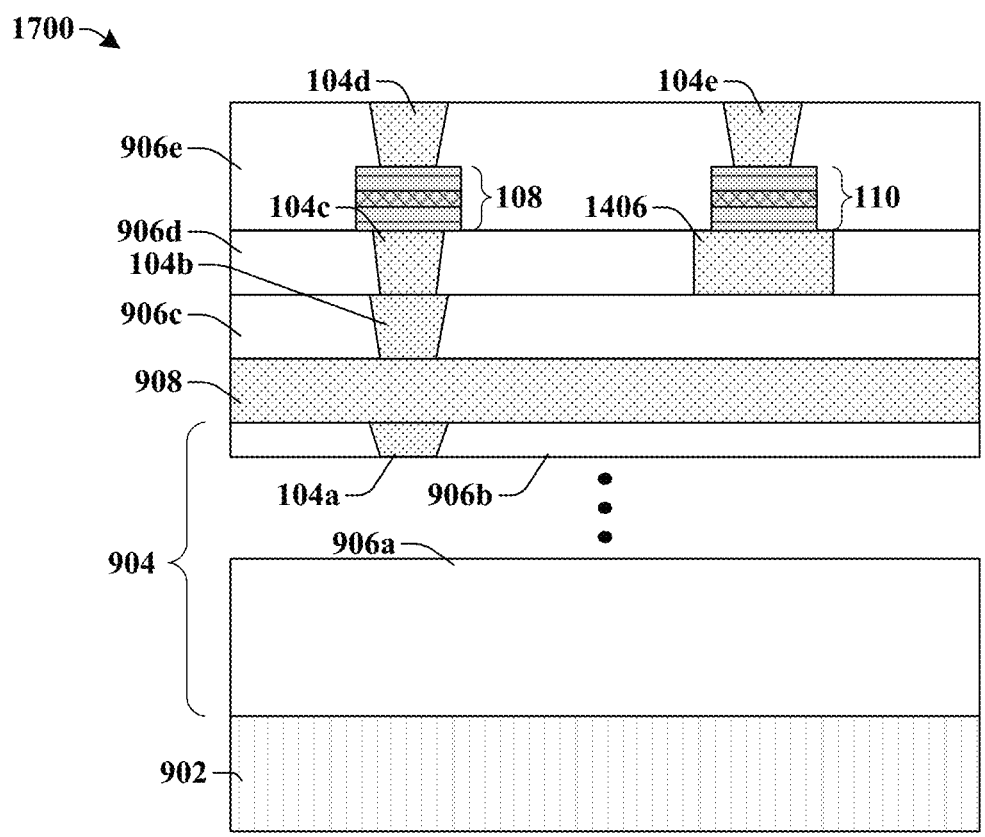

As shown in cross-sectional view 1700 of FIG. 17, in some embodiments, a fifth interconnect dielectric layer 906e may be arranged over the fourth interconnect dielectric layer 906d and surrounding the first and second selector structures 108, 110. In some embodiments, a fourth contact via 104d and a fifth contact via 104e are formed within the fifth interconnect dielectric layer 906e and directly contact the first selector structure 108 and the second selector structure 110, respectively. In some embodiments, the fifth interconnect dielectric layer 906e is formed using the same or similar processes as the first through fourth interconnect dielectric layers 906a-d, and the fourth and fifth contact vias 104d, 104e may be formed using the same or similar processes as the first through third contact vias 104a-c.

Figure 18:
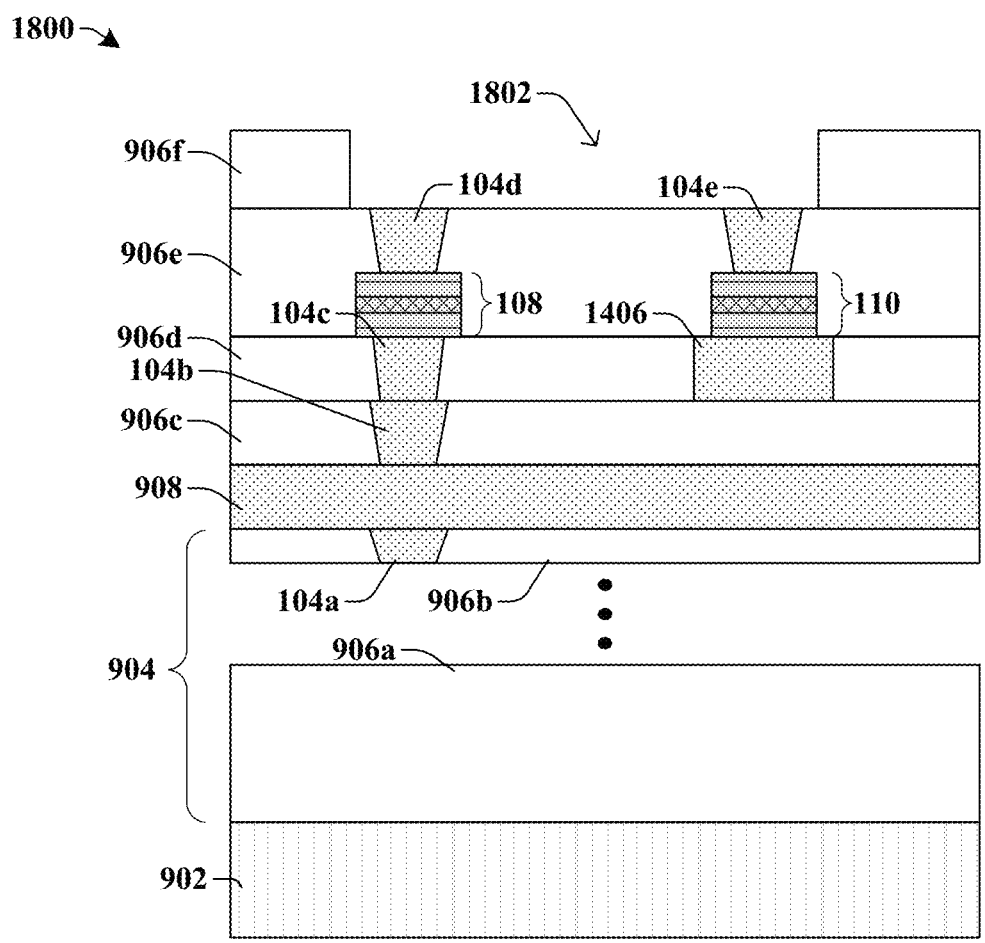

As shown in cross-sectional view 1800 of FIG. 18, in some embodiments, a sixth interconnect dielectric layer 906f is formed over the fifth interconnect dielectric layer 906e, and a fourth opening 1802 is formed within the sixth interconnect dielectric layer 906f. The fourth opening 1802 is arranged directly over the first and second selector structures 108, 110 and exposes the fourth and fifth contact vias 104d, 104e. In some embodiments, the sixth dielectric is formed using the same or similar processes as the first through fifth interconnect dielectric layers 906a-e, and the fourth opening 1802 is formed using the same or similar process as the first opening (1002 of FIG. 10), second opening (1302 of FIG. 13), and/or third opening (1304 of FIG. 13).

Figure 19:
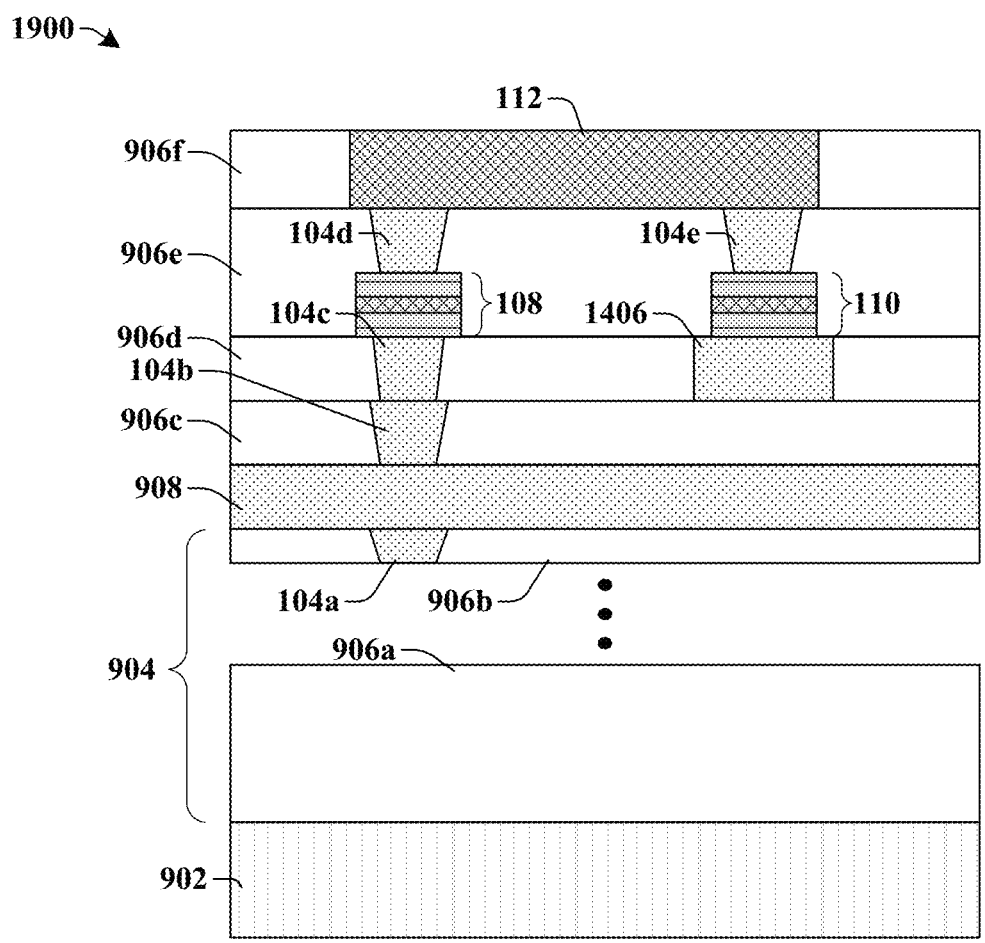

As shown in cross-sectional view 1900 of FIG. 19, in some embodiments, a spin orbit torque (SOT) layer 112 is formed within the fourth opening (1802 of FIG. 18) of the sixth interconnect dielectric layer 906f. In some embodiments, the SOT layer 112 comprises a conductive metal such as, for example, platinum, tungsten, tantalum, or some other suitable conductive metal. The SOT layer 112 continuously extends across the fourth and fifth contact vias 104d, 104e. Thus, in some embodiments, the first selector structure 108 and the second selector structure 110 are electrically coupled to the SOT layer 112. In some embodiments, the SOT layer 112 is formed through various steps comprising deposition processes (e.g., PVD, CVD, ALD, sputtering, etc.) and removal processes (e.g., wet etching, dry etching, CMP, etc.).

Figure 20:
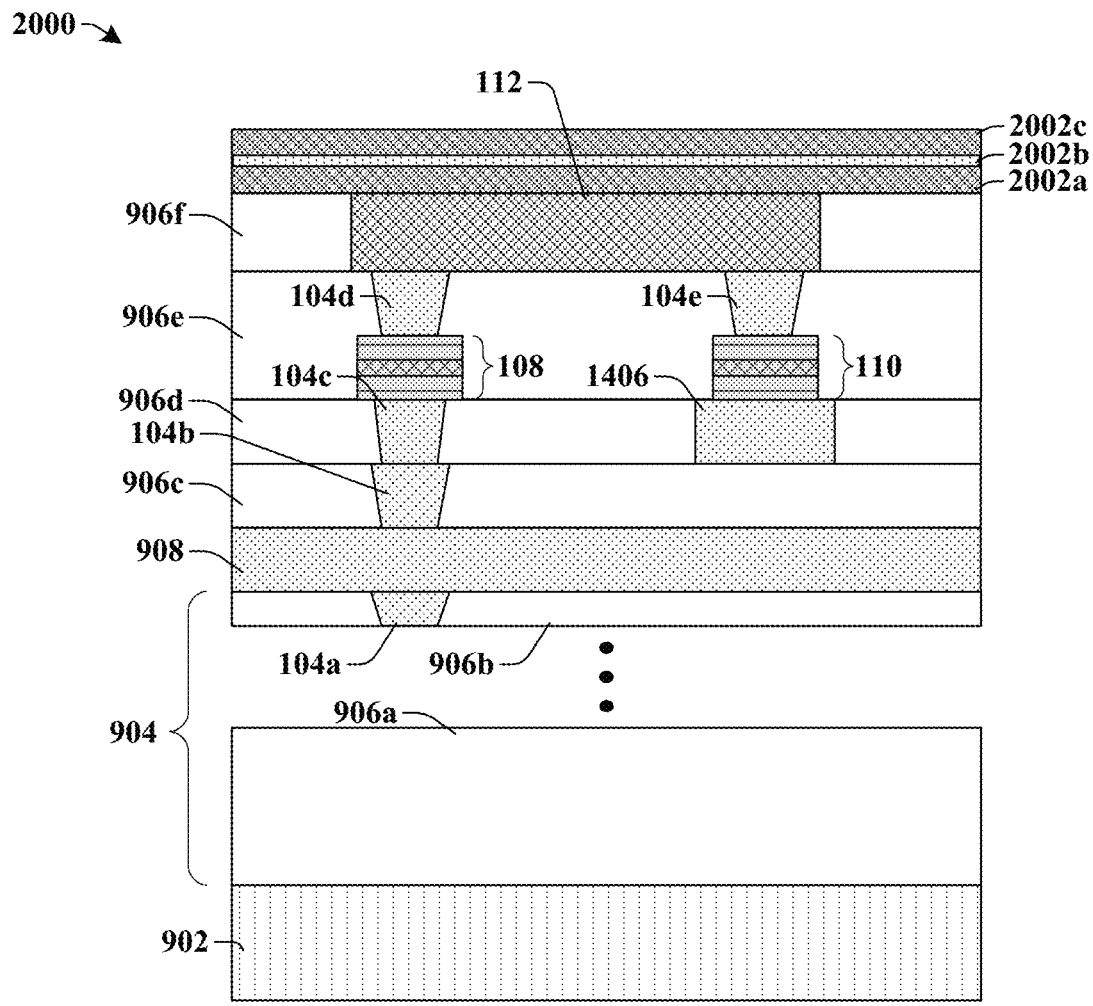

As shown in cross-sectional view 2000 of FIG. 20, in some embodiments, a first ferromagnetic material 2002a, a tunnel barrier material 2002b, and a second ferromagnetic material 2002c are formed over the SOT layer 112. The tunnel barrier material 2002b may be arranged between the first ferromagnetic material 2002a and the second ferromagnetic material 2002c, and in some embodiments, the first ferromagnetic material 2002a directly contacts the SOT layer 112. In some embodiments, the first ferromagnetic material 2002a, the tunnel barrier material 2002b, and the second ferromagnetic material 2002c may be formed through various steps of deposition processes (e.g., PVD, CVD, ALD, sputtering, etc.). In some embodiments, the first and second ferromagnetic materials 2002a, 2002c comprise a ferromagnetic material and thus, may comprise, for example, cobalt iron, cobalt iron boron, or some other suitable ferromagnetic material. Further, in some embodiments, the tunnel barrier material 2002b may comprises a material that allows electron tunneling to occur between the first and second ferromagnetic materials 2002a, 2002c. In some embodiments, for example, the tunnel barrier material 2002b may comprise aluminum oxide, titanium oxide, manganese oxide, or some other suitable material.

Figure 21:
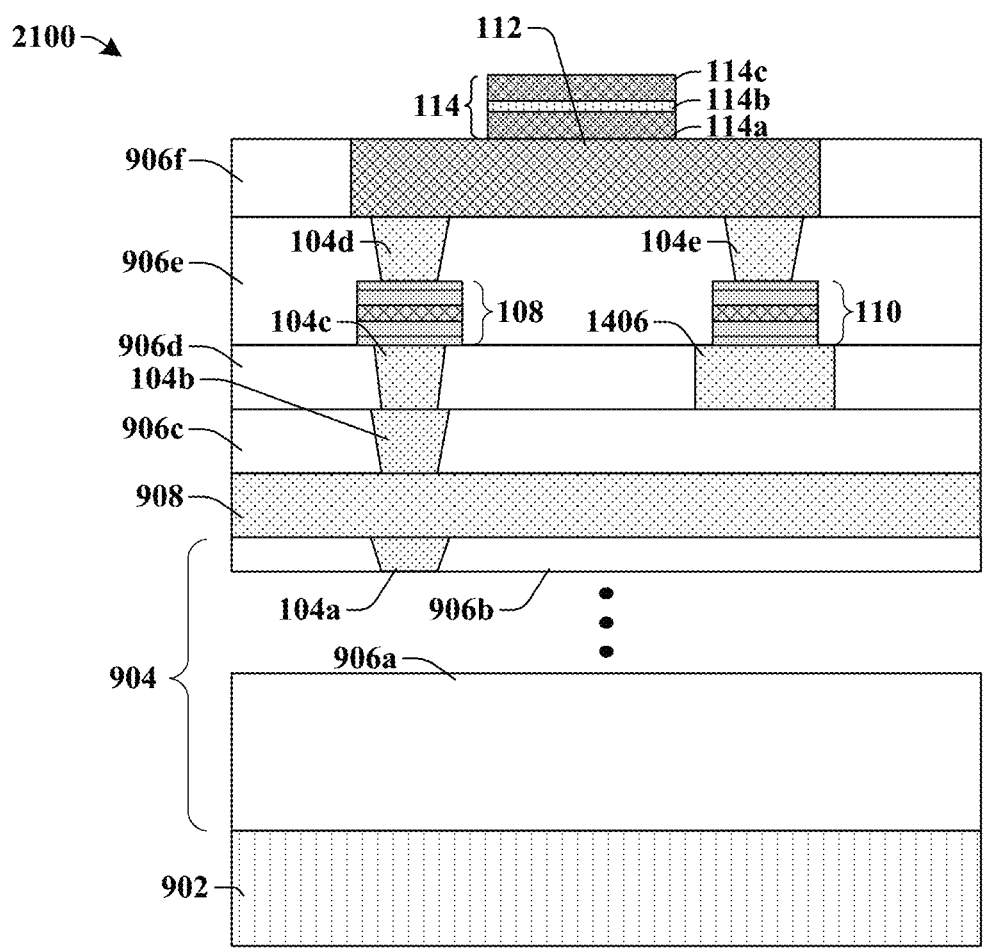

As shown in cross-sectional view 2100 of FIG. 21, in some embodiments, a removal process is performed to remove outer portions of the first ferromagnetic material (2002a of FIG. 20), the tunnel barrier material (2002b of FIG. 20), and the second ferromagnetic material (2002c of FIG. 20) to form a magnetic tunnel junction (MTJ) structure 114 arranged over the SOT layer 112. The MTJ structure 114 comprises a free layer 114a, a diffusion barrier layer 114b, and a reference layer 114c corresponding to the first ferromagnetic material (2002a of FIG. 20), the tunnel barrier material (2002b of FIG. 20), and the second ferromagnetic material (2002c of FIG. 20), respectively. The free layer 114a directly contacts the SOT layer 112, and the diffusion barrier layer 114b is arranged between the free layer 114a and the reference layer 114c. In some embodiments, the removal process is performed by way of patterning processes (e.g., photolithography/etching).

Figure 22:
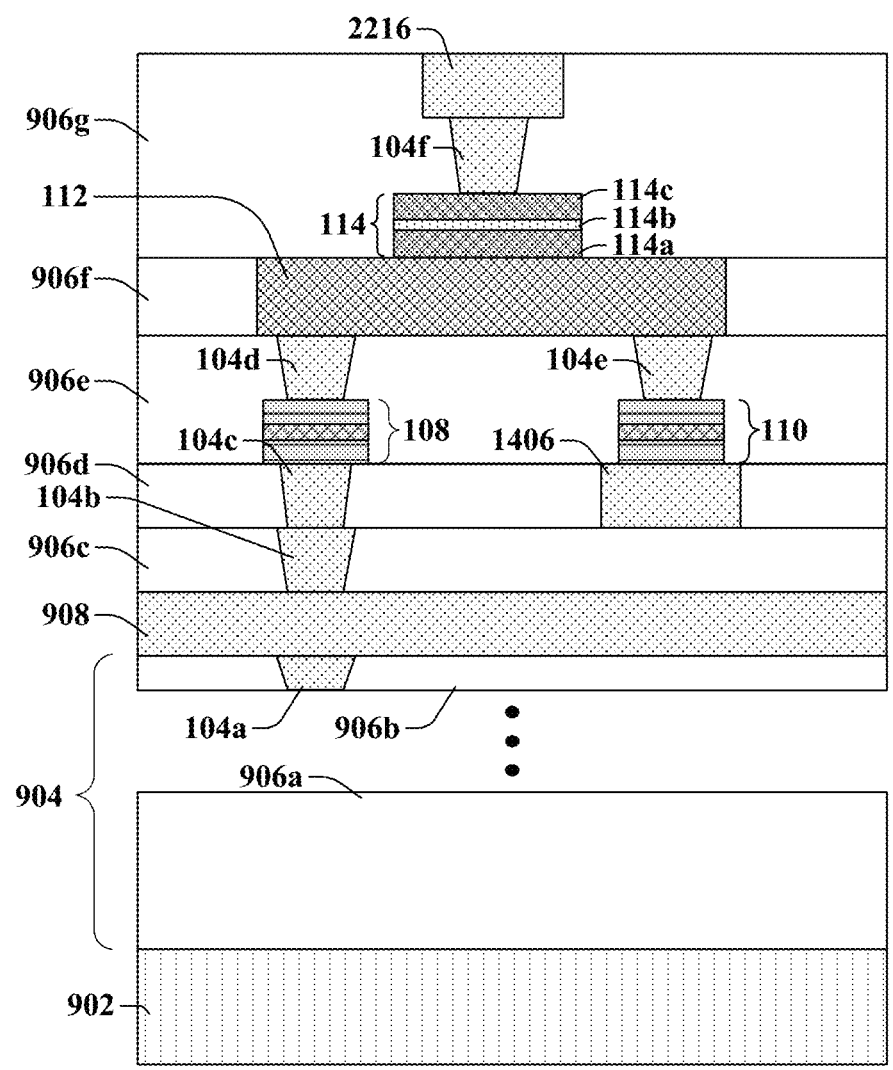

As shown in cross-sectional view 2200 of FIG. 22, in some embodiments, a seventh interconnect dielectric layer 906g is formed over the MTJ structure 114. Further, a third conductive wire 2216 may be formed within the seventh interconnect dielectric layer 906g and over the MTJ structure 114. In some embodiments, the third conductive wire 2216 defines a read word line (RWL). Thus, in some embodiments, the third conductive wire 2216 may correspond to the RWL 116 of FIG. 1A, for example. In some embodiments, a sixth contact via 104f may couple the third conductive wire 2216 to the MTJ structure 114. In some embodiments, the seventh interconnect dielectric layer 906g may be formed using the same or similar processes as the first through sixth interconnect dielectric layers 906a-g, and the sixth contact via 104f may be formed using the same or similar processes as the first through fifth contacts vias 104a-e. Further, in some embodiments, the third conductive wire 2216 may be formed using the same or similar processes as the first and second conductive wires 908, 1406. The first, second, and third conductive wires 908, 1406, 2216 may be coupled to control circuitry to perform read and write operations on the MTJ structure 114, and the first and second selector structures 108, 110 may increase the reliability of the overall SOT MRAM cell comprising the MTJ structure 114 in FIG. 22, in some embodiments.

It will be appreciated that the method illustrated in FIGS. 9-22 may, for example, be modified to form the SOT MRAM memory cells in any one of FIG. 1A, 3A, 4A, 5A, 6A, 7 or 8, and that such modified methods are within the scope of the disclosure.

Figure 23:
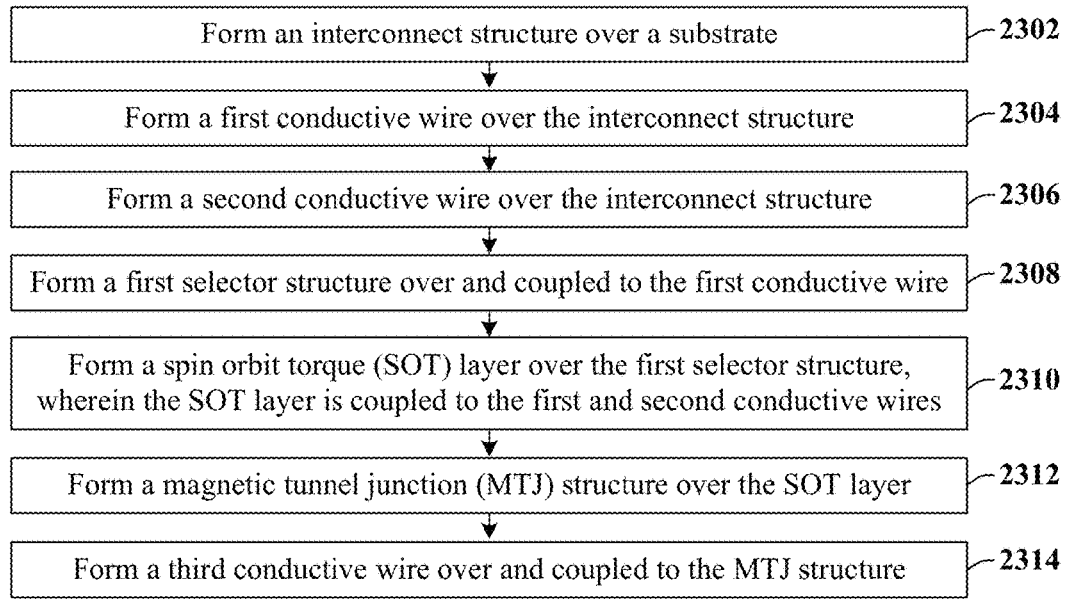
FIG. 23 illustrates a flow diagram of some embodiments of a method corresponding to FIGS. 9-22.

FIG. 23 illustrates a flow diagram of some embodiments of a method 2300 of forming an SOT MRAM cell as illustrated in FIG. 1A, for example.

While method 2300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2302, an interconnect structure is formed over a substrate.

At act 2304, a first conductive wire is formed over the interconnect structure. FIG. 9 illustrates a cross-sectional view 900 of some embodiments corresponding to acts 2302 and 2304.

At act 2306, a second conductive wire is formed over the interconnect structure. FIGS. 13 and 14 illustrate cross-sectional views 1300 and 1400, respectively, of some embodiments corresponding to act 2306.

At act 2308, a first selective structure is formed over the first conductive wire, and the first selective structure is coupled to the first conductive wire. FIGS. 15 and 16 illustrate cross-sectional views 1500 and 1600, respectively, of some embodiments corresponding to act 2308.

At act 2310, a spin orbit torque (SOT) layer is formed over the first selector structure, and the SOT layer is coupled to the first and second conductive wires. FIG. 19 illustrates a cross-sectional view 1900 of some embodiments corresponding to act 2310.

At act 2312, a magnetic tunnel junction (MTJ) structure is formed over the SOT layer. FIGS. 20 and 21 illustrate cross-sectional views 2000 and 2100, respectively, of some embodiments corresponding to act 2312.

At act 2314, a third conductive wire is formed over the MTJ structure, and the third conductive wire is coupled to the MTJ structure. FIG. 22 illustrates a cross-sectional view 2200 of some embodiments corresponding to act 2314.

Therefore, the present disclosure relates to a high-density SOT MRAM cell array wherein each SOT MRAM cell is coupled to a RWL, a SL, and a WWL and selected using control circuitry and selector structures.

Accordingly, in some embodiments, the present disclosure relates to a memory device comprising: a spin orbit torque (SOT) layer arranged over a substrate; a magnetic tunnel junction (MTJ) structure arranged over the SOT layer, wherein the MTJ structure comprises a free layer, a reference layer, and a diffusion barrier layer disposed between the free layer and the reference layer; a first conductive wire arranged below the SOT layer and coupled to the SOT layer; a second conductive wire arranged below the SOT layer and coupled to the SOT layer; a third conductive wire arranged over the MTJ structure; and a first selector structure arranged between the first conductive wire and the SOT layer.

In other embodiments, the present disclosure relates to a memory device comprising: a first spin orbit torque (SOT) layer arranged over a substrate; a first magnetic tunnel junction (MTJ) structure arranged over the first SOT layer and directly contacting the first SOT layer; a first selector structure arranged over the first MTJ structure; a second SOT layer laterally spaced from the first SOT layer; a second MTJ structure arranged over the second SOT layer, directly contacting the second SOT layer, and laterally spaced from the first MTJ structure; a second selector structure arranged over the second MTJ structure; a first conductive wire coupled to the first and second selector structures; a second conductive wire coupled to the first SOT layer; a third conductive wire coupled to the second SOT layer; a third selector structure arranged below and coupled to the first SOT layer; a fourth selector structure arranged below and coupled to the second SOT layer; and a fourth conductive wire coupled to the third and fourth selector structures.

In yet other embodiments, the present disclosure relates to a method of forming a memory device, the method comprising: forming an interconnect structure on a substrate; forming a first conductive wire over the interconnect structure; forming a second conductive wire over the interconnect structure; forming a first selector structure over and coupled to the first conductive wire; forming a spin orbit torque (SOT) layer over the first selector structure, wherein the SOT layer is coupled to the first and second conductive wires; forming a magnetic tunnel junction (MTJ) structure over the SOT layer; and forming a third conductive wire over and coupled to the MTJ structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
a spin orbit torque (SOT) layer arranged over a substrate;
a magnetic tunnel junction (MTJ) structure arranged over the SOT layer, wherein the MTJ structure comprises a free layer, a reference layer, and a diffusion barrier layer disposed between the free layer and the reference layer;
a first conductive wire arranged below the SOT layer and coupled to the SOT layer;
a second conductive wire arranged below the SOT layer and coupled to the SOT layer;
a third conductive wire arranged over the MTJ structure;
a first selector structure arranged between the first conductive wire and the SOT layer; and
a second selector structure arranged between the second conductive wire and the SOT layer or between the MTJ structure and the third conductive wire.

2. The memory device of claim 1, wherein the second selector structure is arranged between the second conductive wire and the SOT layer.

3. The memory device of claim 2, wherein the first selector structure and the second selector structure are laterally separated from one another, are a same type, and have a same structure.

4. The memory device of claim 1, wherein the second selector structure is arranged between the MTJ structure and the third conductive wire.

5. The memory device of claim 4, wherein the second selector structure is a diode.

6. The memory device of claim 4, further comprising:
a third selector structure arranged between the second conductive wire and the substrate.

7. The memory device of claim 1, wherein the first conductive wire is coupled to write word line control circuitry, the second conductive wire is coupled to source line control circuitry, and the third conductive wire is coupled to read word line control circuitry.

8. A memory device comprising:
a first spin orbit torque (SOT) layer arranged over a substrate;
a first magnetic tunnel junction (MTJ) structure arranged over the first SOT layer and directly contacting the first SOT layer;
a first selector structure arranged over the first MTJ structure;
a second SOT layer laterally spaced from the first SOT layer;
a second MTJ structure arranged over the second SOT layer, directly contacting the second SOT layer, and laterally spaced from the first MTJ structure;
a second selector structure arranged over the second MTJ structure;
a first conductive wire coupled to the first and second selector structures;
a second conductive wire coupled to the first SOT layer;
a third conductive wire coupled to the second SOT layer;
a third selector structure arranged below and coupled to the first SOT layer;
a fourth selector structure arranged below and coupled to the second SOT layer; and
a fourth conductive wire coupled to the third and fourth selector structures.

9. The memory device of claim 8, wherein the third and fourth selector structures are continuously connected to one another.

10. The memory device of claim 8, further comprising:
a first conductive contact arranged between the first SOT layer and the third selector structure, wherein the first conductive contact directly contacts the third selector structure; and
a second conductive contact arranged between the second SOT layer and the fourth selector structure, wherein the second conductive contact directly contacts the fourth selector structure, and wherein the second conductive contact is laterally spaced apart from the first conductive contact by a non-zero distance.

11. The memory device of claim 10, wherein the non-zero distance is greater than about 20 nanometers.

12. The memory device of claim 8, wherein the first and second selector structures are a same type and have a same structure.

13. The memory device of claim 8, wherein the first and fourth conductive wires are coupled to word line control circuitry, and wherein the second and third conductive wires are coupled to source line control circuitry.

14. The memory device of claim 8, further comprising:
a third SOT layer arranged below the fourth conductive wire;
a third MTJ structure arranged between the third SOT layer and the fourth conductive wire and directly contacting the third SOT layer;
a fifth selector structure between the fourth conductive wire and the third MTJ structure; and
a fifth conductive wire arranged below and coupled to the third SOT layer.

15. The memory device of claim 14, wherein the second, third, and fifth conductive wires are parallel to one another and are coupled to source line control circuitry.

16. A method of forming a memory device, the method comprising:
forming an interconnect structure on a substrate;
forming a first conductive wire over the interconnect structure;
forming a second conductive wire over the interconnect structure;
forming a first selector structure over and coupled to the first conductive wire;
forming a spin orbit torque (SOT) layer over the first selector structure, wherein the SOT layer is coupled to the first and second conductive wires;
forming a magnetic tunnel junction (MTJ) structure over the SOT layer;
forming a third conductive wire over and coupled to the MTJ structure; and
forming a second selector structure overlying the second conductive wire between the forming of the second conductive wire and the SOT layer or overlying the MTJ structure between the forming of the MTJ structure and the third conductive wire.

17. The method of claim 16, wherein the third conductive wire is formed overlying the second selector structure, such that the second selector structure is arranged between the third conductive wire and the MTJ structure.

18. The method of claim 16, wherein the SOT layer is formed overlying the second selector structure, such that the second selector structure is arranged between the second conductive wire and the SOT layer.

19. The method of claim 16, wherein the second conductive wire is arranged above the first conductive wire.

20. The method of claim 16, wherein the first and third conductive wires are coupled to a first control circuitry, and wherein the second conductive wire is coupled to a second control circuitry different than the first control circuitry.

* * * * *